United States Patent
Tomita et al.

(10) Patent No.: US 10,554,035 B2
(45) Date of Patent: Feb. 4, 2020

(54) ARC DETECTOR AND ARC DETECTION METHOD

(71) Applicant: OMRON Corporation, Kyoto-shi, Kyoto (JP)

(72) Inventors: Kohei Tomita, Kyoto (JP); Toru Fujii, Kyoto (JP); Reiko Hattori, Souraku-gun (JP); Takeshi Ashida, Nara (JP)

(73) Assignee: OMRON Corporation, Kyoto-shi (JP)

( * ) Notice: Subject to any disclaimer, the term of this patent is extended or adjusted under 35 U.S.C. 154(b) by 274 days.

(21) Appl. No.: 15/657,306

(22) Filed: Jul. 24, 2017

(65) Prior Publication Data

US 2017/0324236 A1 Nov. 9, 2017

Related U.S. Application Data

(63) Continuation of application No. PCT/JP2016/050952, filed on Jan. 14, 2016.

(30) Foreign Application Priority Data

Feb. 18, 2015 (JP) ................................. 2015-029790

(51) Int. Cl.
*H02H 1/00* (2006.01)
*H02S 50/00* (2014.01)
(Continued)

(52) U.S. Cl.
CPC ........... *H02H 1/0015* (2013.01); *G01R 31/08* (2013.01); *G01R 31/1227* (2013.01);
(Continued)

(58) Field of Classification Search
CPC .... G01R 31/08; G01R 31/1227; G01R 31/40; H02H 1/0015; H02H 7/20; H02H 3/32; H02H 3/10; H01L 31/02021; H02S 50/00
See application file for complete search history.

(56) References Cited

U.S. PATENT DOCUMENTS 8,924,169 B1 * 12/2014 Ledenev ............ G01R 31/1227
361/93.2
2012/0316804 A1 12/2012 Oberhauser

FOREIGN PATENT DOCUMENTS

CN 102854426 A 1/2013
DE 10318951 A1 11/2004
(Continued)

OTHER PUBLICATIONS

English translation of Written Opinion of PCT/JP2016/050952 dated Apr. 19, 2016 from the International Searching Authority.
(Continued)

*Primary Examiner* — Amy He
(74) *Attorney, Agent, or Firm* — Metrolex IP Law Group, PLLC

(57) ABSTRACT

An arc detector includes a current sensor, a power spectrum conversion unit that converts an output from the current sensor to a power spectrum, a section value obtaining unit that divides an arc measurement section for the power spectrum into a plurality of regions, and obtains, from region values for the plurality of regions excluding a maximum one of the region values, a region value to be a section value of the arc measurement section, and an arc determination unit that determines a presence of an arc by comparing the section value with a threshold.

15 Claims, 17 Drawing Sheets

(51) Int. Cl.
    *G01R 31/08*    (2006.01)
    *G01R 31/12*    (2006.01)
    *H01L 31/02*    (2006.01)
    *H02H 3/10*     (2006.01)
    *H02H 3/32*     (2006.01)
    *H02H 7/20*     (2006.01)
    *G01R 31/40*    (2014.01)

(52) U.S. Cl.
    CPC ......... *H01L 31/02021* (2013.01); *H02H 3/10* (2013.01); *H02H 3/32* (2013.01); *H02H 7/20* (2013.01); *H02S 50/00* (2013.01); *G01R 31/40* (2013.01)

(56) References Cited

FOREIGN PATENT DOCUMENTS

| | | |
|---|---|---|
| DE | 10359532 B3 | 6/2005 |
| JP | H04-147066 A | 5/1992 |
| JP | 2014-134445 A | 7/2014 |

OTHER PUBLICATIONS

The International Search Report of PCT/JP2016/050952 dated Apr. 19, 2016.
The extended European search report dated Mar. 2, 2018 in a counterpart European Patent application.

\* cited by examiner

FIG. 6C  Time waveform

FIG. 6D  FFT analysis

ARC DETECTOR AND ARC DETECTION METHOD

CROSS REFERENCE TO RELATED APPLICATIONS

This application is a continuation application of International Application No. PCT/JP2016/050952, filed on Jan. 14, 2016, which claims priority based on the Article 8 of Patent Cooperation Treaty from prior Japanese Patent Application No. 2015-029790, filed on Feb. 18, 2015, the entire contents of which are incorporated herein by reference.

FIELD

The disclosure relates to an arc detector included in, for example, a photovoltaic power generation system, and to an arc detection method.

BACKGROUND

In recent years, more photovoltaic power generation systems have been built for effective use of renewable energy. This has increased the number of reports on fire accidents caused by arc faults in such photovoltaic power generation systems.

When an arc is generated in a photovoltaic power generation system, the circuits need to be shut down rapidly to prevent fire from the arc. The photovoltaic power generation system may need rapid shutdown of its circuits in response to an arc, and thus may include an arc detector.

An arc, either a serial arc or a parallel arc, generated in a photovoltaic power generation system including solar cell strings connected to a power conditioner causes noise. An output line of each solar cell string outputs a signal containing noise from the arc superimposed on the switching noise from the power conditioner. Thus, the arc detector obtains a signal from an output line and obtains an arc signal from the obtained signal to detect an arc.

This type of arc detector may have a known structure shown in Patent Literature 1 or 2. The arc detector described in Patent Literature 1, which is included in a photovoltaic power generation system connected to a power conditioner, detects an arc with the processing described below. The arc detector first detects a current flowing through the photovoltaic power generation system, determines the power spectrum of the detected current, and divides the power spectrum into multiple bands. The arc detector then filters one or more interference signals (noise) generated from the power conditioner from the power spectrum within those separate bands, and detects an electrical arc in the high-voltage system using the remaining signals within each band, which are other than the interference signals. When filtering the interference signals, the arc detector identifies one or more peak values in one or more frequency bands, and at least partially narrows the power spectrum of each of these frequency bands. In other words, the arc detector in Patent Literature 1 detects an arc without using the preset frequency band of interference signals generated from the power conditioner, and detects an arc by narrowing the power spectrum of the preset frequency band of the interference signals.

The arc detector described in Patent Literature 2 detects an arc using the power spectrum of a voltage, instead of using the power spectrum of a current flowing through an output line of a solar cell string, because noise in accordance with the magnitude of an arc is superimposed on the switching noise of the power conditioner. More specifically, this arc detector detects the voltage from the output line of the solar cell string using a voltage sensor, determines the power spectrum of the voltage based on the detected voltage, and detects an arc based on the determined power spectrum. In this case, the frequency band of the switching noise from the power conditioner is specified. The power spectrum of the specified frequency band is excluded from the target for arc detection, whereas the power spectrum of the remaining frequency band is used to detect an arc.

CITATION LIST

Patent Literature

Patent Literature 1: U.S. Patent Application Publication US2012/0316804A1 (published on Dec. 13, 2012)
Patent Literature 2: Japanese Unexamined Patent Application Publication No. 2014-134445 (published on Jul. 24, 2014)

SUMMARY

Technical Problem

However, the arc detector described in Patent Literature 1, which presets the frequency band of noise from the power conditioner, cannot detect an arc when noise is generated in a frequency band different from the preset frequency band. When, for example, the frequency of noise from the power conditioner changes after the replacement of the power conditioner with a different type of power conditioner, such noise affects the arc detector, which then cannot detect an arc with high accuracy.

The arc detector described in Patent Literature 2 includes the voltage sensor to obtain a voltage value from the output line of each solar cell string. This voltage value cannot be obtained as easily as a current value obtained from the output line using the current sensor. In detail, although the current value can be obtained simply from the electrodes of the current sensor arranged on the outer surface of the insulation coating of the output line, the voltage value is to be obtained from the electrodes of the voltage sensor connected to the terminals of the output line. Work on such high-voltage output lines can involve possible dangers for workers, and also the voltage sensor needs to have a high breakdown voltage.

One or more aspects of the present invention are directed to an arc detector and an arc detection method that can reduce the influence of noise generated from an external device connected to solar cells, and can easily detect an arc generated in a photovoltaic power generation system.

Solution to Problem

In response to the above issue, an arc detector according to an aspect of the present invention includes a current sensor that detects an output current from a distributed direct-current power supply, a power spectrum conversion unit that converts the output current from the current sensor to a power spectrum, a section value obtaining unit that divides an arc measurement section for the power spectrum having a predetermined frequency range into a plurality of regions, and obtains, from region values determined for the plurality of regions each indicating a magnitude of a power spectrum and excluding a maximum one of the region values, a region value to be a section value of the arc measurement section, and an arc determination unit that determines a presence of an arc based on the section value.

Advantageous Effects

The arc detector and the arc detection method according to embodiments of the present invention can reduce the influence of noise generated from the external device connected to the distributed direct-current power supply, and can easily detect an arc.

BRIEF DESCRIPTION OF THE DRAWINGS

FIG. 6C is a schematic waveform diagram showing the waveform of a signal with and without arcs input through a filter in FIG. 6B, and FIG. 6D is a waveform diagram showing the spectrum of power with and without arcs to be processed in a CPU in FIG. 6B.

DETAILED DESCRIPTION

First Embodiment

Overview of Photovoltaic Power Generation System

Figure 1:
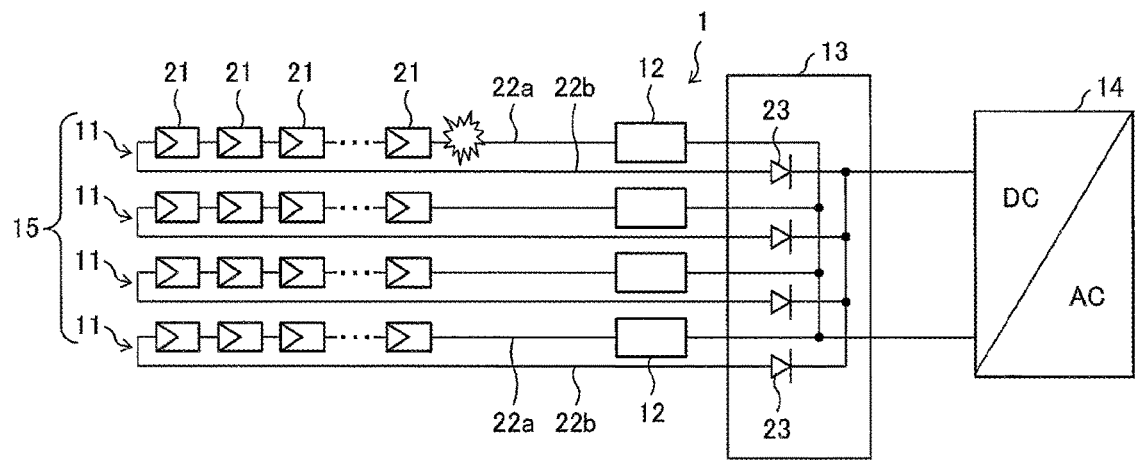
FIG. 1 is a schematic circuit diagram of a photovoltaic power generation system including arc detectors according to one embodiment of the present invention.

Embodiments of the present invention will now be described with reference to the drawings. FIG. 1 is a schematic circuit diagram of a photovoltaic power generation system including arc detectors according to one embodiment of the present invention.

As shown in FIG. 1, a photovoltaic power generation system 1 includes a plurality of solar cell strings 11, arc detectors 12, a junction box 13, and a power conditioning system (PCS) 14.

Each solar cell string (distributed direct-current power supply) 11 includes a number of solar modules 21 that are connected in series. Each solar module 21 includes a plurality of solar cells (not shown) connected in series, which are panels. The solar cell strings 11 form a photovoltaic array 15. Each solar cell string 11 is connected to the PCS (external device) 14 via the junction box 13.

The PCS 14 converts direct-current (DC) power input from each solar cell string 11 to alternating-current (AC) power, and outputs the AC power.

The junction box 13 connects the solar cell strings 11 in parallel. More specifically, the junction box 13 connects output lines 22a connected to first terminals of the solar cell strings 11 together, and connects output lines 22b connected to second terminals of the solar cell strings 11 together. Each output line 22b has a diode 23 arranged for preventing a reverse current.

In the present embodiment, the arc detector 12 is arranged for each solar cell string 11 at its output line 22a.

Arc Detector 12

Figure 2:
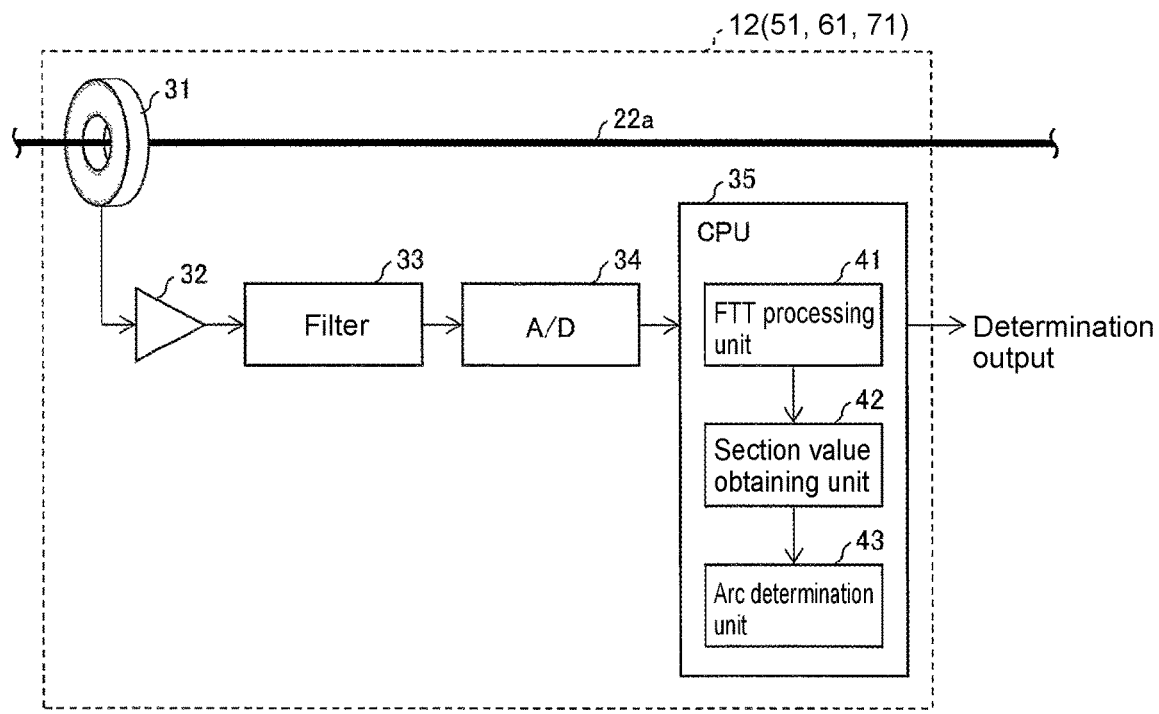
FIG. 2 is a block diagram of an arc detector shown in FIG. 1.

FIG. 2 is a block diagram of the arc detector 12. As shown in FIG. 2, the arc detector 12 includes a current sensor 31, an amplifier 32, a filter 33, an analog-digital (A-D) conversion unit 34, and a central processing unit (CPU) 35.

The current sensor 31 detects a current flowing through the output line 22a. The amplifier 32 amplifies the current detected by the current sensor 31.

The filter 33 is a band-pass filter (BPF), and passes currents with frequencies in a predetermined range, selectively from currents output from the amplifier 32. In the present embodiment, the filter 33 passes currents having frequencies of 40 to 100 kHz. This structure eliminates, from currents output from the amplifier 32, currents with frequency components containing much switching noise generated from a converter (DC-DC converter) included in the PCS 14.

Figure 3:
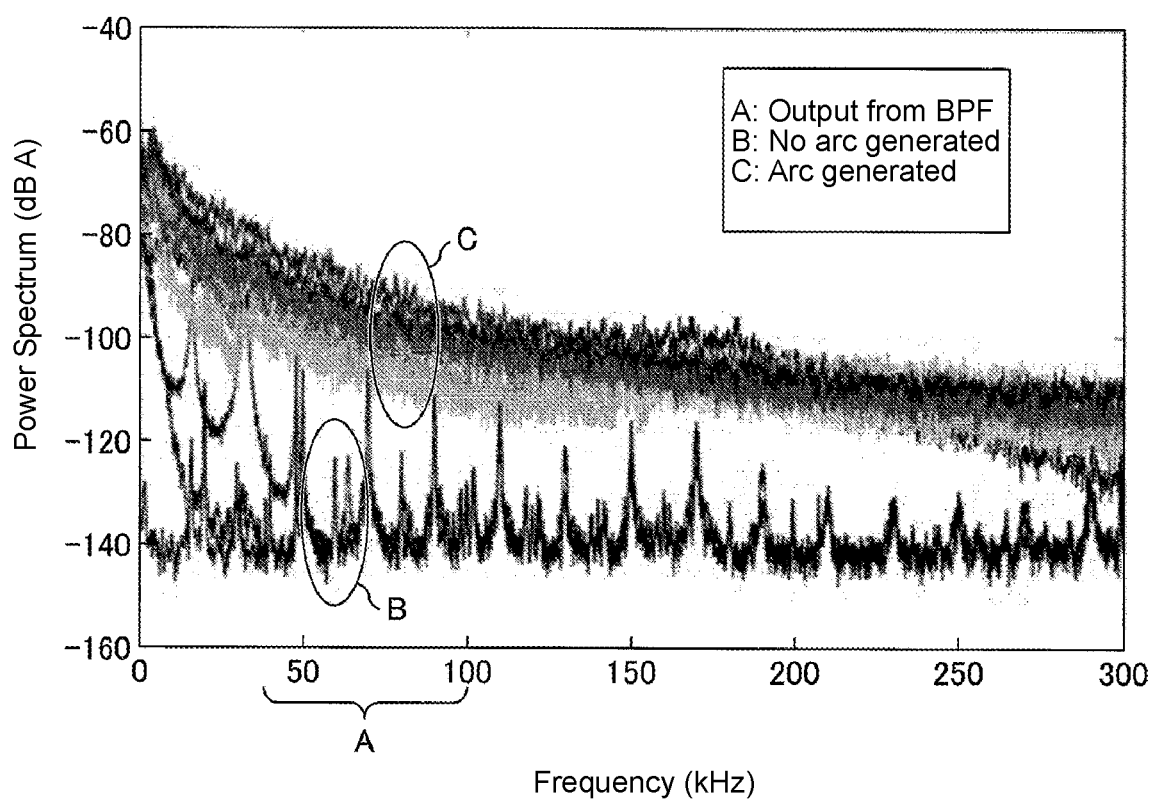
FIG. 3 is a graph showing the relationship between the frequency and the fast Fourier transform (FFT) of currents known in the art.

As shown in FIG. 3, the switching noise from the converter included in the PCS 14 typically appears in a relatively low frequency bandwidth of 40 kHz or lower. The current flowing through the output line 22a detected by the current sensor 31 is filtered through the filter 33, which passes currents having frequencies of 40 to 100 kHz. The filter 33 thus eliminates much of the above switching noise.

In FIG. 3, the range A is the frequency range of currents that pass through the filter 33, the range B includes noise signals from the PCS 14 when no arc is being generated, and the range C includes noise signals from the PCS 14 on which arc noise is superimposed when an arc is being generated.

The A-D conversion unit 34 converts an analog signal representing a current passing through the filter 33 to a digital signal, and inputs the resultant signal into the CPU 35.

As shown in FIG. 2, the CPU 35 includes a fast Fourier transform (FFT) processing unit (power spectrum conversion unit) 41, a section value obtaining unit 42, and an arc determination unit 43.

Figure 4A:
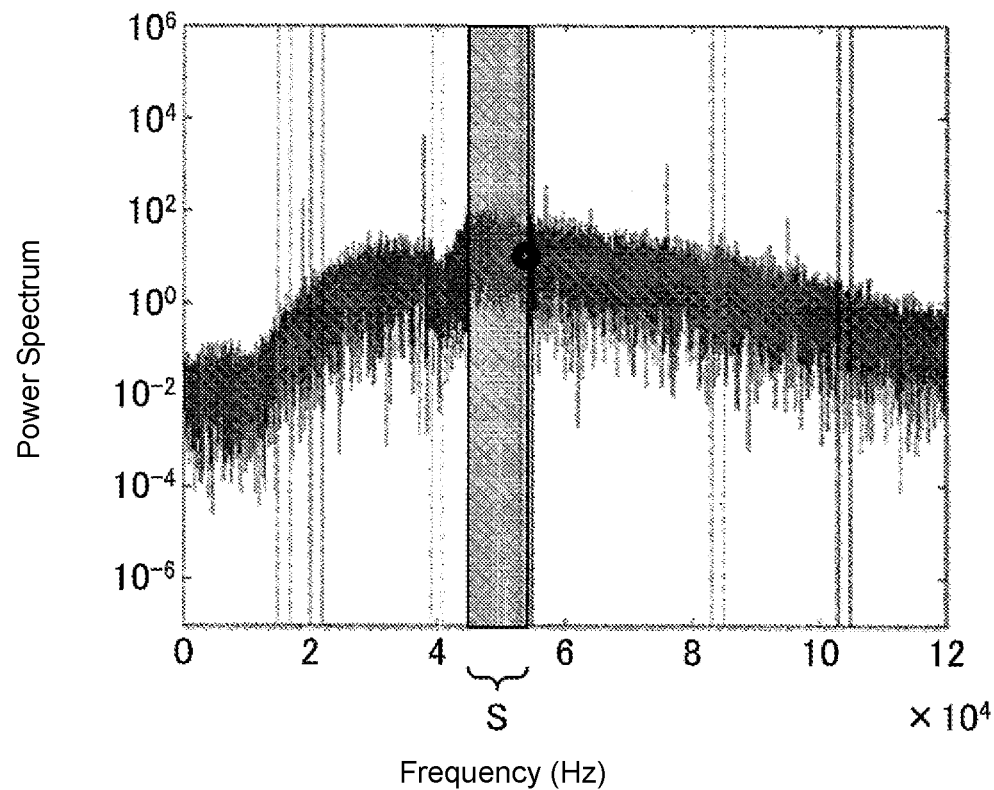
FIG. 4A is a graph showing an arc measurement section for current signals processed by an FFT processing unit when an arc is being generated in solar cell strings.
Figure 4B:
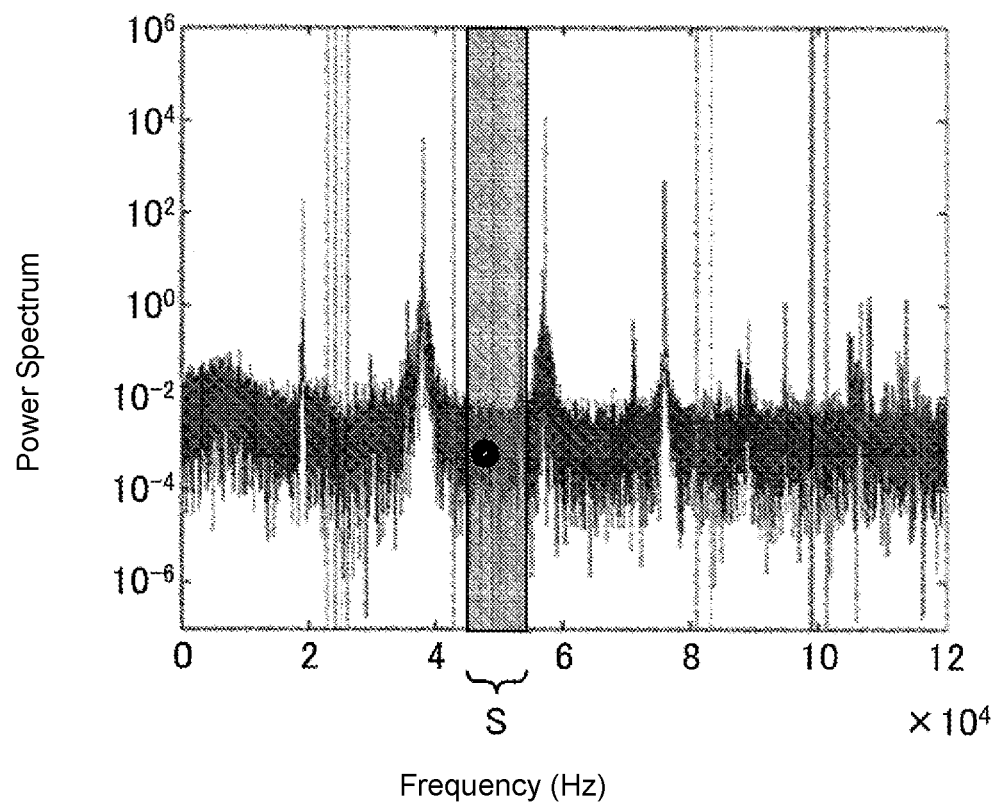
FIG. 4B is a graph showing the arc measurement section for current signals processed by the FFT processing unit when no arc is being generated in the solar cell strings.

The FFT processing unit 41 subjects the digital signal representing the current input from the A-D conversion unit 34 to FFT to generate the power spectrum of the current. As shown in FIGS. 4A and 4B, the FFT processing unit 41 defines a single arc measurement section S for a signal representing a current having frequencies of 40 to 100 kHz that has passed through the filter 33, and performs FFT only for the arc measurement section S. When the arc measurement section includes the power peak of noise from the PCS 14, the arc measurement section preferably ranges from the power peak of noise to at least one of the bottoms at both sides of the peak.

FIG. 4A is a graph showing the arc measurement section S for current signals processed by the FFT processing unit 41 when an arc is being generated in the solar cell strings 11. FIG. 4B is a graph showing the arc measurement section S for current signals processed by the FFT processing unit 41 when no arc is being generated in the solar cell strings 11. For convenience, the graphs in FIGS. 4A and 4B show the values resulting from FFT performed for all the frequency ranges including the arc measurement section S. The same applies to FIGS. 9A to 9C, FIGS. 13A to 13C, FIGS. 14A and 14B, FIGS. 16A to 16C, and FIGS. 20A to 20C described below.

In the present embodiment, the arc measurement section S defined by the FFT processing unit 41 corresponds to the frequency range of 45 to 55 kHz. Through the FFT performed in the particular frequency range in this manner, the arc detector 12 may achieve high-speed processing as a whole when using a low-performance, inexpensive CPU as its CPU 35.

Figure 5:
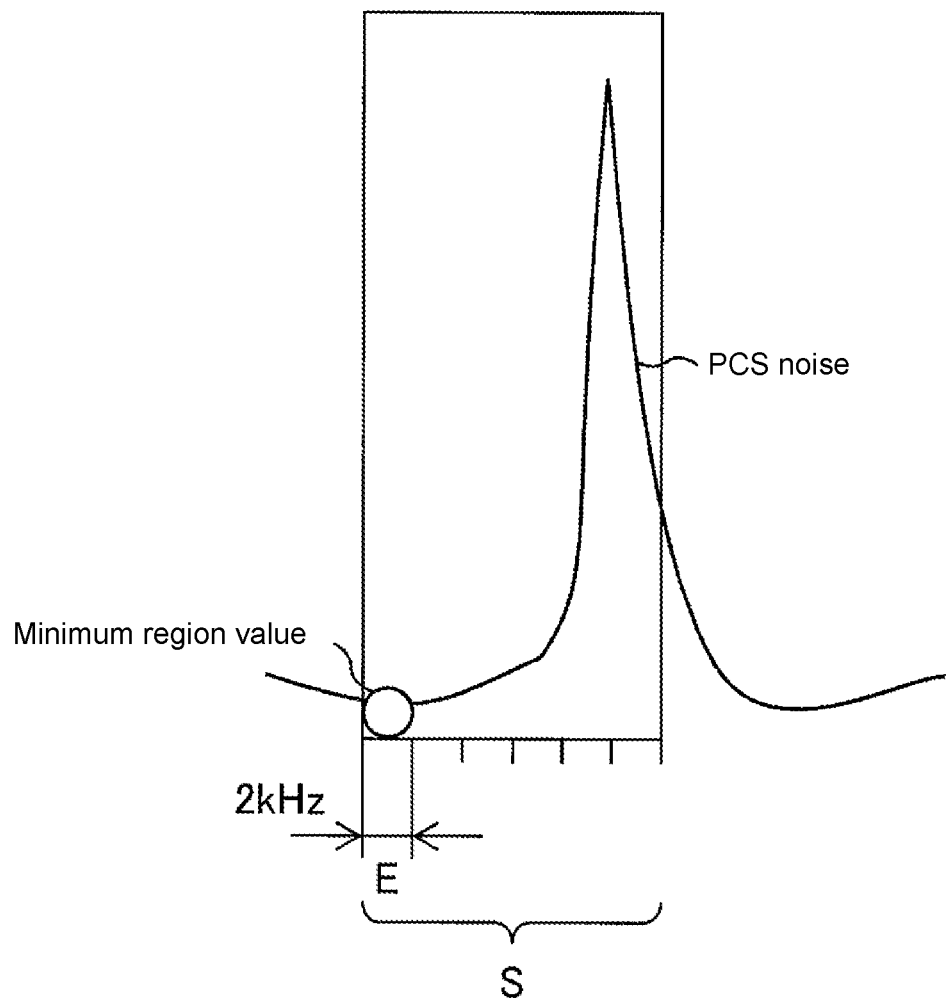
FIG. 5 is a diagram describing the operation of a section value obtaining unit shown in FIG. 2.

FIG. 5 is a diagram describing the operation of the section value obtaining unit 42. The section value obtaining unit 42 divides the arc measurement section S with frequencies of 45 to 55 kHz in which FFT is performed by the FFT processing unit 41 into five regions (regions E) each having a frequency range of 2 kHz as shown in, for example, FIG. 5. The section value obtaining unit 42 then determines the value of the power spectrum (power spectrum of noise) for each region as its region value The section value obtaining unit 42 obtains a minimum one of the five region values as a section value for the arc measurement section S. When PCS noise is superimposed, the region value for the frequency having the PCS noise superimposed in the power spectrum of the arc measurement section S is to be greater. Thus, the minimum region value is selected. A region with a small region value in the arc measurement section S is selected to eliminate the influence of the PCS noise.

The above region value may be any value representing the relationship between the magnitudes of the power spectrums of the different regions using, for example, the sum value or the average value of the power spectrum of each region.

The region defined by the section value obtaining unit 42 is not limited to 2 kHz, and may be set to, for example, the smallest region based on the resolution of the FFT processing unit 41 or in other words the CPU 35. Each region value may be obtained by integrating the data representing the power spectrum of each region obtained from the FFT processing unit 41.

The section value obtained by the section value obtaining unit 42 is not limited to the minimum region value, and may be a relatively small region value in the arc measurement section S. For example, the section value may be one of region values in the arc measurement section S remaining after excluding the maximum region value. When the arc measurement section S has a frequency range greater than 2 kHz, the section value obtaining unit 42 may obtain a region value to be selected as a section value from the arc measurement section S excluding the frequency range of 2 kHz including a frequency corresponding to the maximum value of the power spectrum.

The region value and the region range described above are also applicable to the arc measurement section S and to a noise measurement section N in other embodiments described below.

The arc determination unit 43 compares a section value (Smin) obtained by the section value obtaining unit 42 with a predetermined threshold Ka1 (first threshold), and determines whether the section value (Smin) is greater than the threshold Ka1. The arc determination unit 43 determines that an arc is detected when the section value (Smin) is greater than the threshold Ka1, and determines that no arc is detected when the section value (Smin) is not greater than the threshold Ka1.

The threshold Ka1 may be easily determined by repeatedly performing this arc determination operation. In other words, the threshold Ka1 can be determined without excessive trial and error. Another threshold K used in each of the embodiments described below is also determined in the same manner as the threshold Ka1 described above.

The above process (determination process) is repeatedly performed by the FFT processing unit 41, the section value obtaining unit 42, and the arc determination unit 43. When an arc is detected at least a predetermined number of times out of a predetermined number of times the determination process is performed, the arc determination unit 43 determines that an arc is detected as a final determination result, which is output to an external device.

This determination result is input into, for example, a controller (not shown) for the photovoltaic power generation system 1. When receiving, from the arc determination unit 43, the determination result indicating that an arc is detected, the controller shuts down the circuits of the photovoltaic power generation system 1 to prevent the arc from causing fire or damaging the photovoltaic power generation system 1.

Operation of Arc Detector 12

Figure 6A:
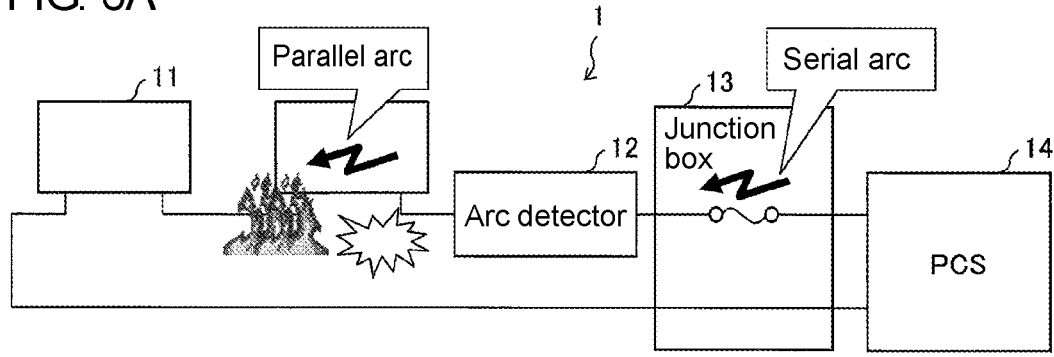
FIG. 6A is a diagram describing generation of arcs in the photovoltaic power generation system shown in FIG. 1.
Figure 6B:
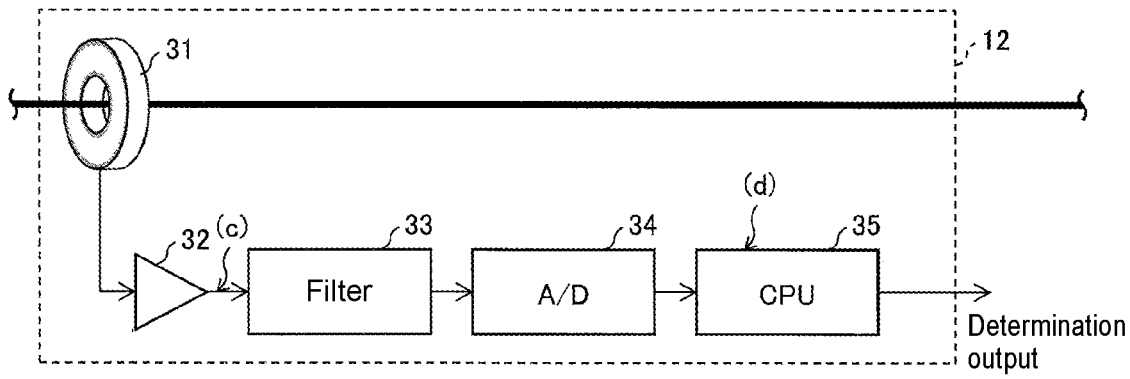
FIG. 6B is a diagram showing an overview of an arc detection operation performed in the arc detector shown in FIG. 2.
Figure 6B:
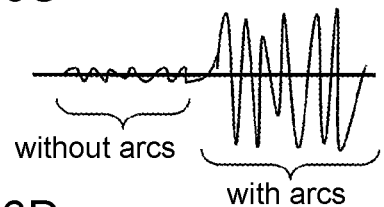
Figure 6B:
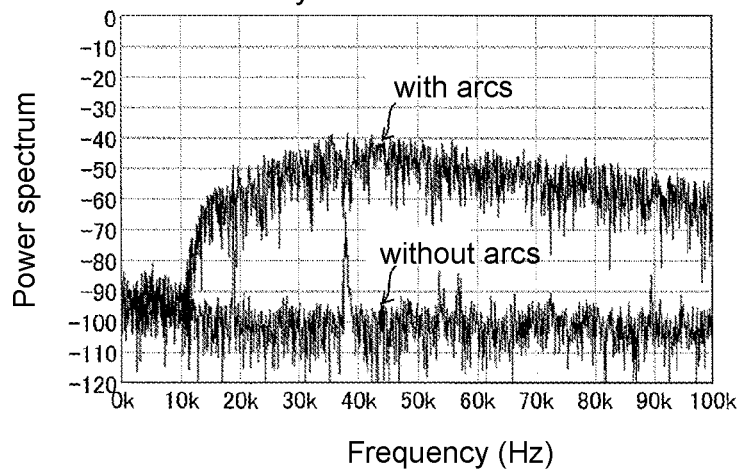
Figure 7:
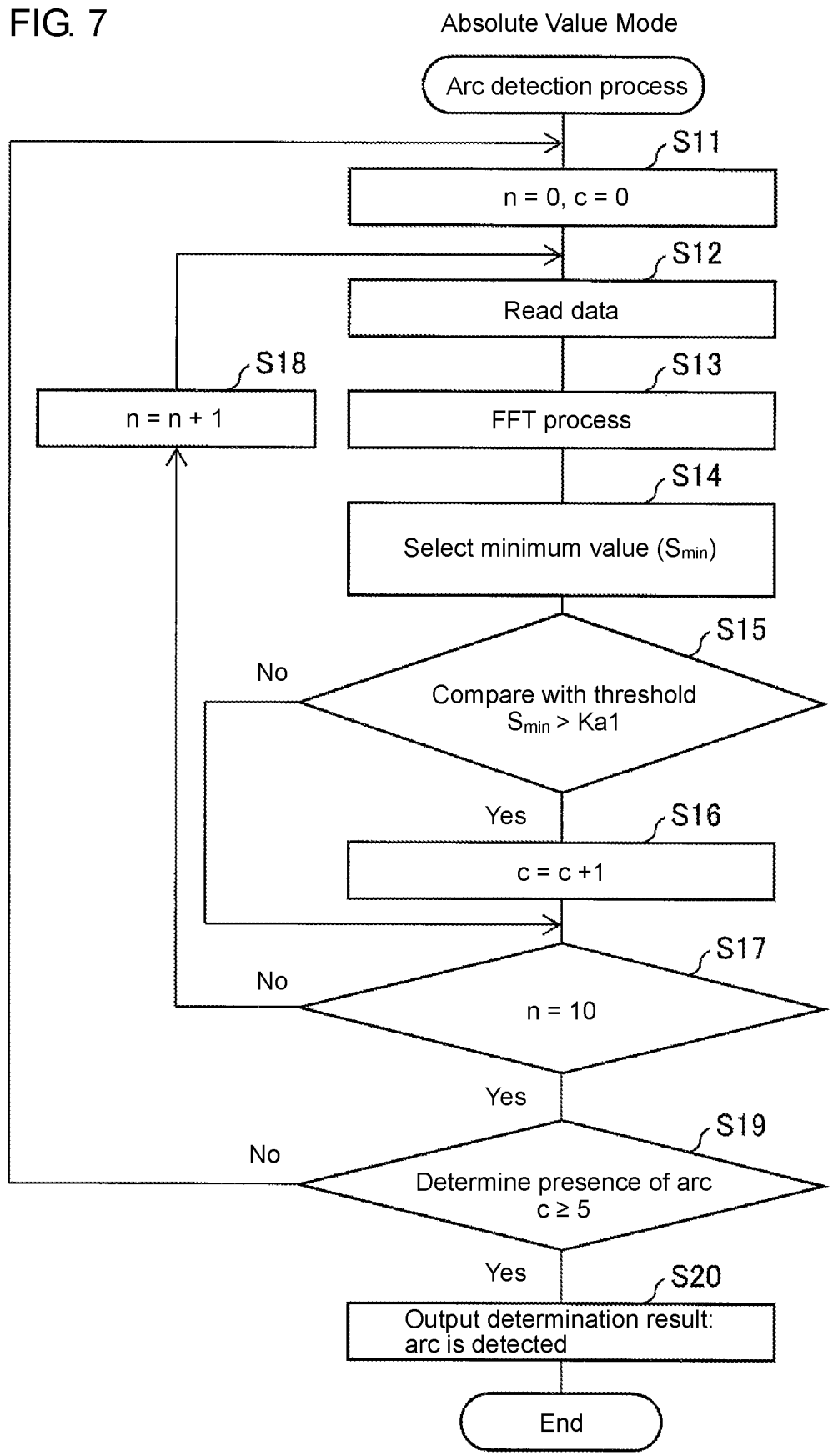
FIG. 7 is a flowchart showing the operation of the arc detector shown in FIG. 2.

The operation of the arc detector 12 in the structure described above will now be described. FIG. 6A is a diagram describing generation of arcs (parallel and serial arcs) in the photovoltaic power generation system 1. FIG. 6B is a diagram showing an overview of an arc detection operation performed in the arc detector 12. FIG. 7 is a flowchart showing the operation of the arc detector 12 for detecting an arc using an absolute value. In this mode using an absolute value, an arc is detected by comparing the section value of the arc measurement section S obtained by the section value obtaining unit 42 with a predetermined threshold.

When arcs (parallel arc and series arc) are generated in the photovoltaic power generation system 1 as shown in FIG. 6A, a signal representing a current detected by the current sensor 31 in the arc detector 12 as shown in FIG. 6B includes noise from a converter in the PCS 14 and noise from the arcs. The CPU 35 performs an FFT analysis and detects arcs with the operation shown in FIG. 7. As shown in FIG. 6D, the power spectrum obtained from the current signal subjected to FFT is substantially constant when no arc is being generated. When an arc is being generated, the power spectrum indicates a surge with noise from the arc being superimposed on noise from the converter in the PCS 14.

In detecting arcs, as shown in FIG. 7, the arc determination unit 43 first resets counters n and c (S11). The counter n counts the number of times arc determination is performed, whereas the counter c counts the number of times the arc determination results in detecting an arc.

The FFT processing unit 41 reads data about a current flowing through the output line 22b that has been detected by the current sensor 31, passed through the filter 33, and converted by A-D conversion performed by the A-D conversion unit 34 (S12). The FFT processing unit 41 then subjects the data to an FFT process (S13) to generate the power spectrum of the current.

The section value obtaining unit 42 divides the arc measurement section S having frequencies of 45 to 55 kHz in which FFT is performed by the FFT processing unit 41 into five regions (regions E) each having a frequency range of 2 kHz. The section value obtaining unit 42 then determines a region value (power spectrum) for each region. The section value obtaining unit 42 obtains a minimum one of the five region values as a section value (Smin) of the arc measurement section S (S14).

The arc determination unit 43 compares the section value (Smin) obtained by the section value obtaining unit 42 with a predetermined threshold Ka1 (first threshold) (S15). When the section value (Smin) is greater than the threshold Ka1, the arc determination unit 43 determines that an arc is detected. The counter c then increments its count by one. The processing advances to S17. When the section value (Smin) is not greater than the threshold Ka1 as a result of the determination (S15), the arc determination unit 43 determines that an arc is not detected. In this case, the counter c does not increment its count by one. The processing advances to S17.

In S17, the arc determination unit 43 determines whether the count of the counter n reaches 10, or in other words whether n=10 (S17). When the condition n=10 is not satisfied, the counter n increments its count by one (S18). The processing returns to S12.

When n=10 in S17, the arc determination unit 43 determines whether the count of the counter c indicating the number of times an arc is detected is more than or equal to 5 (S19). When the count of the counter c is less than 5, the processing returns to S11.

When the count of the counter c is more than or equal to 5 in S19, the arc determination unit 43 outputs a determination result indicating that an arc is detected (an arc detected) (S20). In the present embodiment, as described above, the arc determination unit 43 outputs a determination result indicating that an arc is detected when an arc is detected five or more times out of ten times the arc determination is performed.

When the controller for the photovoltaic power generation system 1 receives a determination result indicating that an arc is detected from the arc determination unit 43, the controller shuts down the circuits of the photovoltaic power generation system 1 to prevent the arc from causing fire or damaging the photovoltaic power generation system 1.

Advantages of Arc Detector 12

As described above, the arc detector 12 according to the present embodiment defines an arc measurement section S having an appropriate frequency range for signals (power spectrum) representing a current detected from the output line (e.g., the output line 22a) of the solar cell strings 11, independently of the frequency bandwidth of noise generated from the PCS 14, and determines the presence of an arc for the defined arc measurement section S. More specifically, the arc detector 12 divides the arc measurement section S into a plurality of regions each having a narrower frequency range than that for the arc measurement section S, selects one of the region values (e.g., a minimum region value) excluding the maximum region value from their region values (power spectrum values) as a section value of the arc measurement section S, compares the section value with a predetermined threshold, and determines the presence of an arc. The arc detector 12 can thus detect an arc generated in the photovoltaic power generation system 1 despite any changes in the frequency bandwidth of noise generated from the PCS 14.

The arc detector 12 determines the presence of an arc detected based on the current flowing through the output line (e.g., the output line 22a) of the solar cell strings 11. A signal (current) containing an arc can thus be detected simply by clamping the output line (e.g., the output line 22a) with the electrodes of the arc detector 12 through the insulation coating of the output line. The arc detector 12 can thus detect an arc more easily and more safely than the structure that determines the presence of an arc based on the voltage across the output line (output line 22a or 22b).

The arc detector 12 with the above structure can reduce the influence of noise generated from the PCS (external device) 14, which is connected to the solar cell strings 11, and can detect an arc in the photovoltaic power generation system 1 accurately and easily.

Modifications

Figure 8:
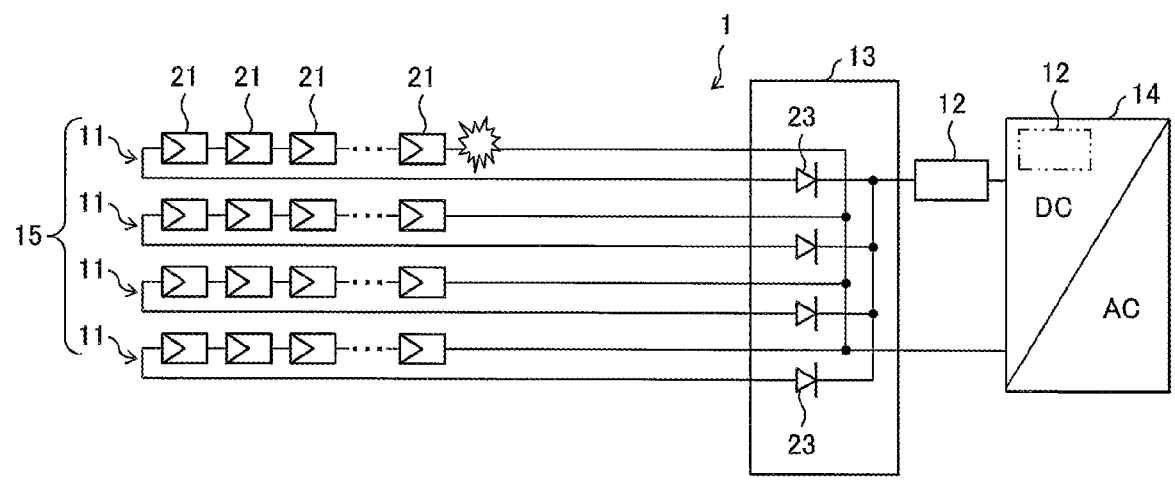
FIG. 8 is a schematic circuit diagram showing a modification of the photovoltaic power generation system shown in FIG. 1.

FIG. 8 is a circuit diagram showing a modification of the photovoltaic power generation system 1 shown in FIG. 1. Although the arc detectors 12 are arranged in one-to-one correspondence with the solar cell strings 11 in the above embodiment, the arrangement of the arc detectors 12 is not limited to this. As shown in FIG. 8, for example, the photovoltaic power generation system 1 including a plurality of solar cell strings 11 may include a single arc detector 12. In the example of FIG. 8, the arc detector 12 is arranged downstream from the junction box 13, or specifically is arranged between the junction box 13 and the PCS 14.

The arc detector 12 may also be arranged in the housing of the PCS 14 as shown in FIG. 8, instead of being arranged between the junction box 13 and the PCS 14. The structure of the photovoltaic power generation system 1 shown in FIG. 8 is also usable in other embodiments described below.

Second Embodiment

Structure of Arc Detector 51

Another embodiment of the present invention will now be described with reference to the drawings. In the present embodiment, a photovoltaic power generation system 1 includes an arc detector 51 (refer to FIG. 2), instead of the arc detector 12. Although the arc detector 51 is shown only in FIG. 2, the arc detector 12 shown in each of FIGS. 1, 6A, 6B, and 8 equates to the arc detector 51.

Figure 9A:
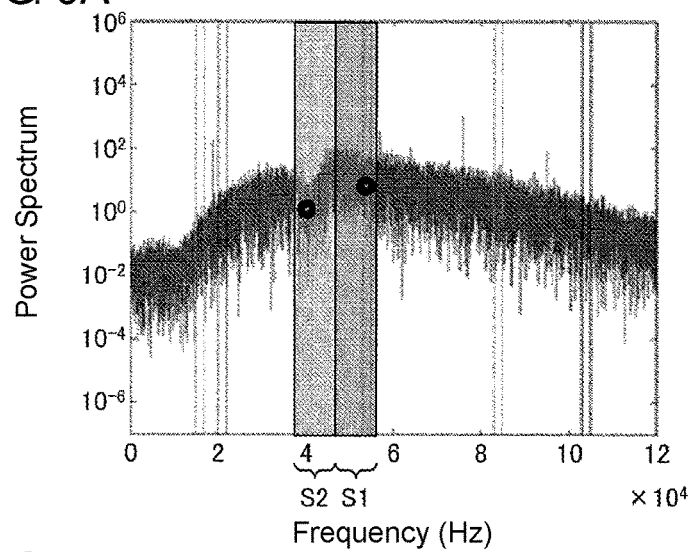
FIG. 9A is a graph showing arc measurement sections for current signals (power spectrum) processed by the FFT processing unit in the arc detector according to another embodiment of the present invention when an arc is being generated in solar cell strings.
Figure 9B:
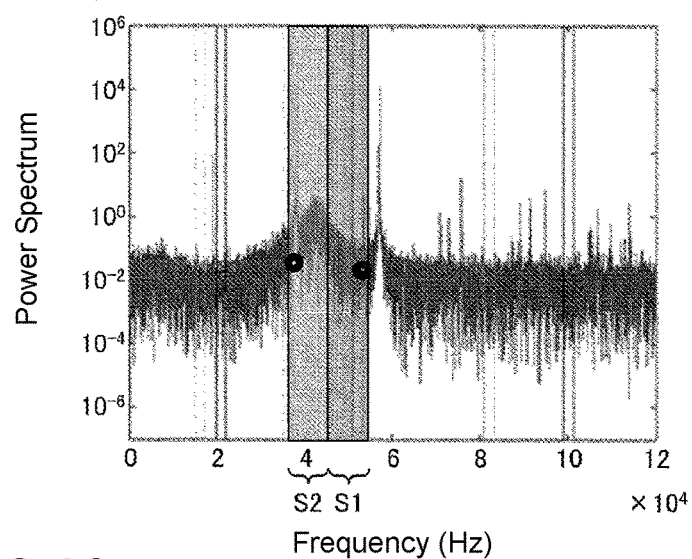
FIG. 9B is a graph showing the arc measurement sections for current signals processed by the FFT processing unit when an arc different from the arc in the example of FIG. 9A is being generated.
Figure 9C:
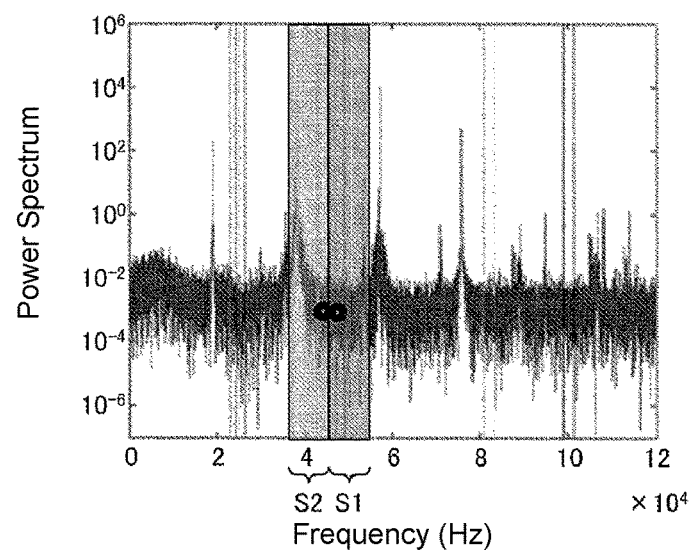
FIG. 9C is a graph showing the arc measurement sections for current signals processed by the FFT processing unit when no arc is being generated in the solar cell strings.

In the same manner as the arc detector 12, the arc detector 51 detects an arc in the absolute value mode. FIG. 9A is a graph showing arc measurement sections S1 and S2 for current signals (power spectrum) processed by the FFT processing unit 41 in the arc detector 51 according to the present embodiment when an arc is being generated in the solar cell strings 11. FIG. 9B is a graph showing the arc measurement sections S1 and S2 for current signals processed by the FFT processing unit 41 when an arc different from the arc in the example of FIG. 9A is being generated. FIG. 9C is a graph showing the arc measurement sections S1 and S2 for current signals processed by the FFT processing unit 41 in the arc detector 51 when no arc is being generated in the solar cell strings 11.

As shown in FIGS. 4A and 4B, the FFT processing unit 41 in the arc detector 12 described above defines a single arc measurement section S for a signal representing a current having frequencies of 40 to 100 kHz passing through the filter 33, and performs FFT only for the arc measurement section S. In contrast, as shown in FIGS. 9A to 9C, the FFT processing unit 41 in the arc detector 51 (refer to FIG. 2) according to the present embodiment defines two arc measurement sections S1 and S2 for a signal representing a current passing through the filter 33, and performs FFT only for the two arc measurement sections S1 and S2.

In the present embodiment, the arc measurement section S1 is intended for the frequencies of 45 to 55 kHz, whereas the arc measurement section S2 is intended for the frequencies of 35 to 45 kHz. In the present embodiment, the filter 33 passes a signal representing a current having frequencies of, for example, 30 to 100 kHz.

The section value obtaining unit 42 obtains a section value (S1min) of the arc measurement section S1 and a section value (S2min) of the arc measurement section S2 through the same operation as the operation of the section value obtaining unit 42 described above.

The arc determination unit 43 compares the sum (S1min+S2min) of the section value (S1min) of the arc measurement section S1 and the section value (S2min) of the arc measurement section S2 with a predetermined threshold Ka2 (second threshold), and determines whether the sum (S1min+S2min) is greater than the threshold Ka2. When the sum (S1min+S2min) is greater than the threshold Ka2, the arc determination unit 43 determines that an arc is detected. When the sum (S1min+S2min) is less than or equal to the threshold Ka2, the arc determination unit 43 determines that no arc is detected.

Operation of Arc Detector 51

Figure 10:
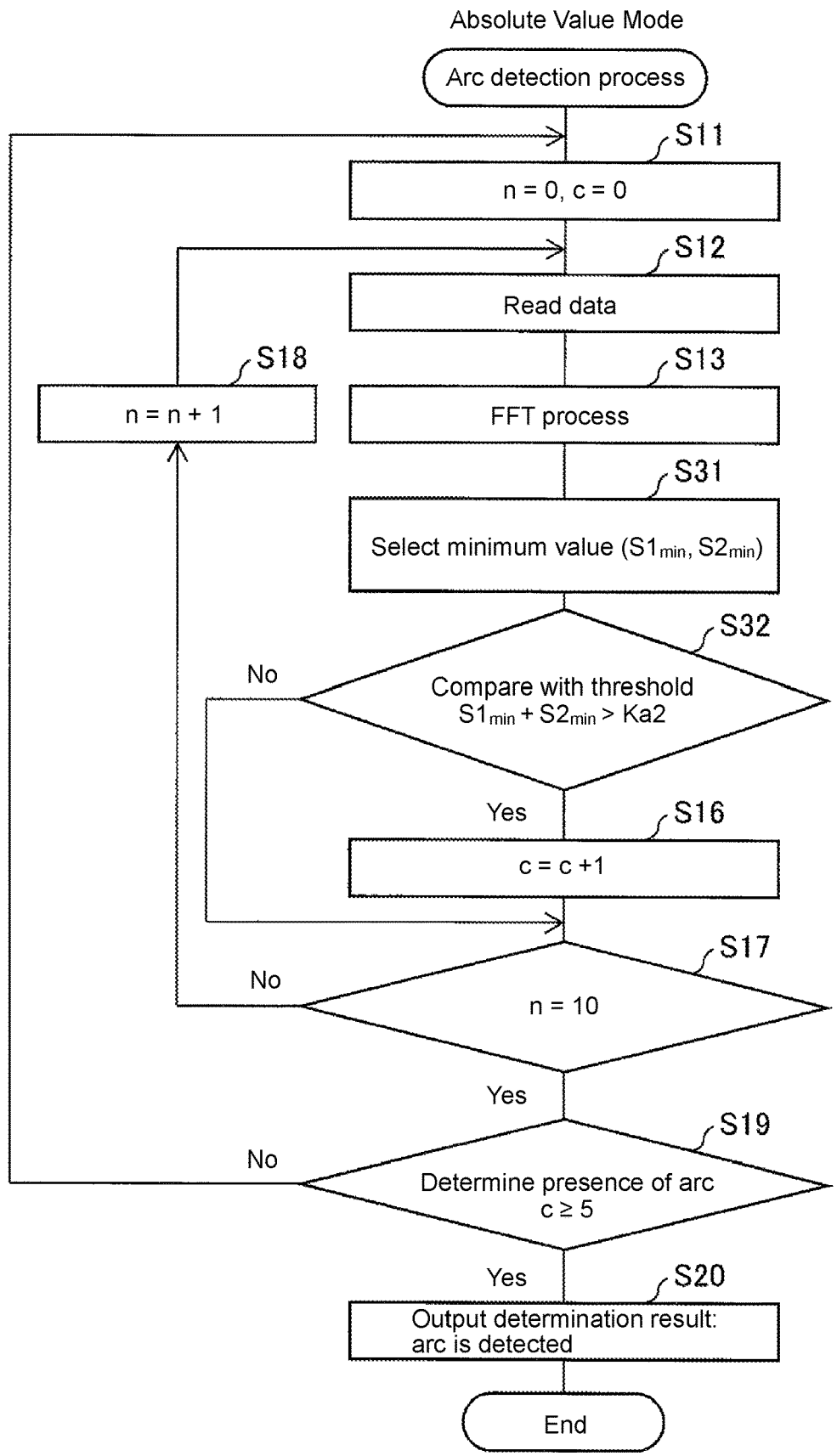
FIG. 10 is a flowchart showing the operation of the arc detector according to another embodiment of the present invention.

The operation of the arc detector 51 with the above structure will now be described. FIG. 10 is a flowchart showing the operation of the arc detector 51. In FIG. 10, the operation steps that are the same as those shown in FIG. 7 are given the same numerals as those steps, and will not be described.

The section value obtaining unit 42 divides each of the arc measurement section S1 (section with 45 to 55 kHz) and the arc measurement section S2 (section with 35 to 45 kHz), in which FFT has been performed by the FFT processing unit 41, into five regions (regions E) each having a frequency range of 2 kHz as shown in FIG. 5. The section value obtaining unit 42 determines the region value (power spectrum) for each region. The section value obtaining unit 42 obtains a minimum one of the five region values for each of the arc measurement sections S1 and S2 as the section values (S1min and S2min) for these arc measurement sections S1 and S2 (S31).

The arc determination unit 43 compares the sum (S1min+S2min) of the section values (S1min and S2min) obtained by the section value obtaining unit 42 with the predetermined threshold Ka2 (second threshold) (S32). The arc determination unit 43 determines that an arc is detected when the sum (S1min+S2min) is greater than the threshold Ka2, and determines that no arc is detected when the sum (S1min+S2min) is less than or equal to the threshold Ka2.

Figure 11:
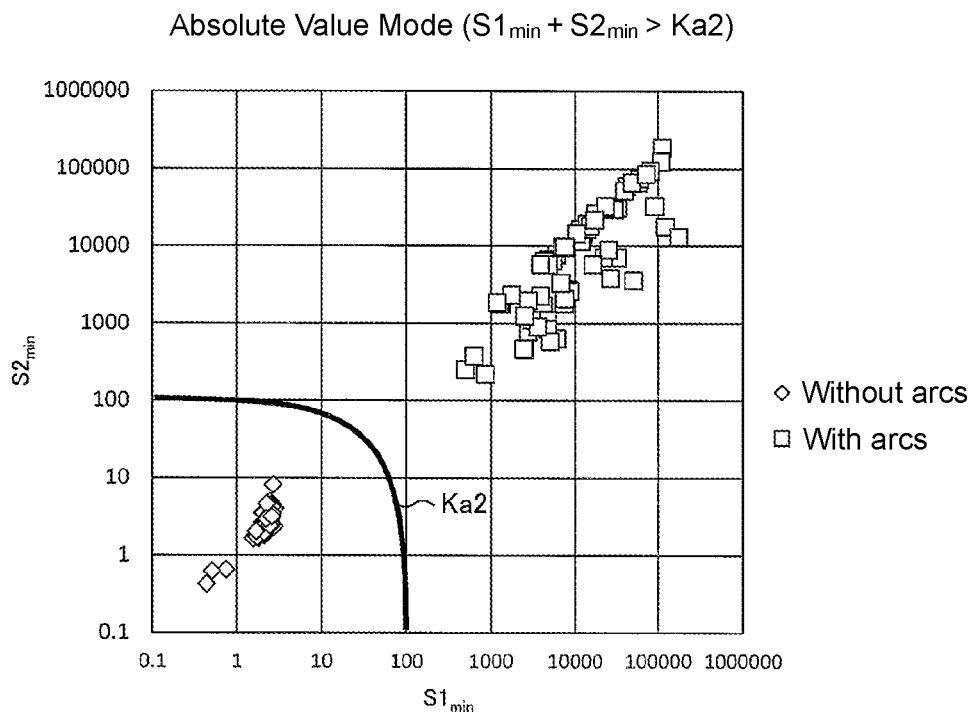
FIG. 11 is a scatter diagram showing the relationship between two section values and a threshold for describing an operation of an arc determination unit included in the arc detector according to another embodiment of the present invention.

FIG. 11 is a graph showing the relationship between the section values S1min and S2min and the threshold Ka2 when the arc determination unit 43 determines that an arc is detected based on the sum (S1min+S2min)>the threshold Ka2. FIG. 11 is a scatter diagram showing the relationship between the section values S1min and S2min and the threshold Ka2.

Figure 12:
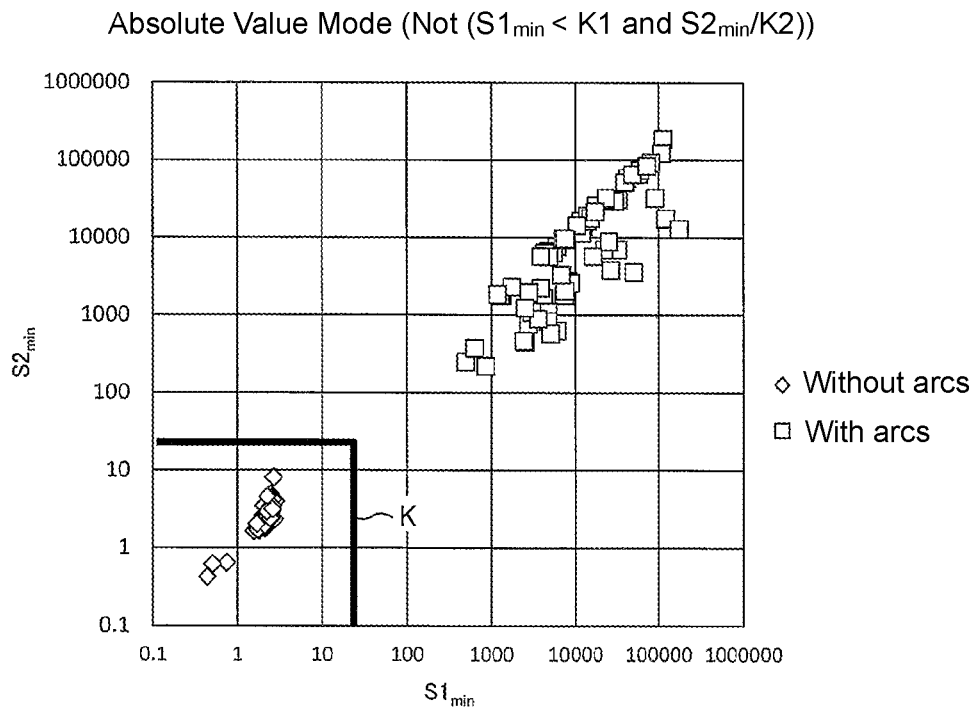
FIG. 12 is a scatter diagram showing the relationship between two section values and a threshold different from the relationship shown in FIG. 11.

FIG. 12 is a graph showing the relationship between the section values S1min and S2min and the threshold Ka2 different from the relationship shown in FIG. 11. In this example of FIG. 12, the arc determination unit 43 determines that an arc is detected based on Not (S1min<K1 and S2min<K2).

Advantages of Arc Detector 51

The arc detector 51 according to the present embodiment has the advantages described below, in addition to the advantages produced by the arc detector 12.

As described above, the arc detector 51 defines the multiple arc measurement sections S1 and S2 for signals (power spectrum) representing a current detected from the output line (e.g., the output line 22a) of the solar cell strings 11, and compares the sum (S1min+S2min) of the section values (S1min and S2min) obtained from the arc measurement sections S1 and S2 with the predetermined threshold Ka2 to determine the presence of an arc. In other words, the arc detector 51 obtains more samples than obtained by the arc detector 12 and determines the presence of an arc, and can thus detect an arc with higher accuracy.

Although the multiple arc measurement sections S1 and S2 are defined continuous from each other in the present embodiment, the arc measurement sections S1 and S2 may be discontinuous and apart from each other. The same applies to other embodiments described blow.

The arc determination unit 43 determines the presence of an arc using the sum (S1min+S2min) of the section values (S1min and S2min) for the multiple arc measurement sections (measurement sections S1 and S2), which are obtained by the section value obtaining unit 42. However, the section value for the multiple sections used by the arc determination unit 43 may not be the sum of the section values for these sections, and may be the product of these section values. More specifically, the section value for the multiple sections used by the arc determination unit 43 may be any value calculated using the section values for the multiple sections. The section value used by the arc determination unit 43 may also be a single section value (e.g., a minimum section value) selected from a plurality of section values. The same applies to arc detectors according to other embodiments described below that obtain section values for a plurality of arc measurement sections S.

Modifications

Figure 13A:
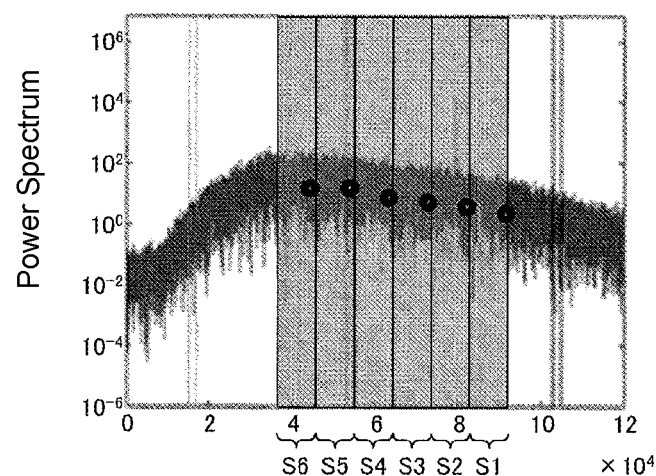
FIG. 13A is a graph showing arc measurement sections for current signals (power spectrum) processed by the FFT processing unit when an arc is being generated in the solar cell strings in the arc detector according to a modification of another embodiment of the present invention.
Figure 13B:
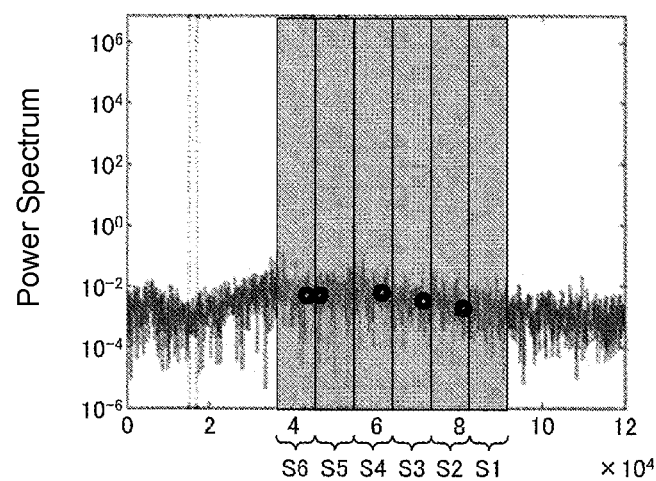
FIG. 13B is a graph showing the arc measurement sections for current signals processed by the FFT processing unit when an arc different from the arc in the example of FIG. 13A is being generated.
Figure 13C:
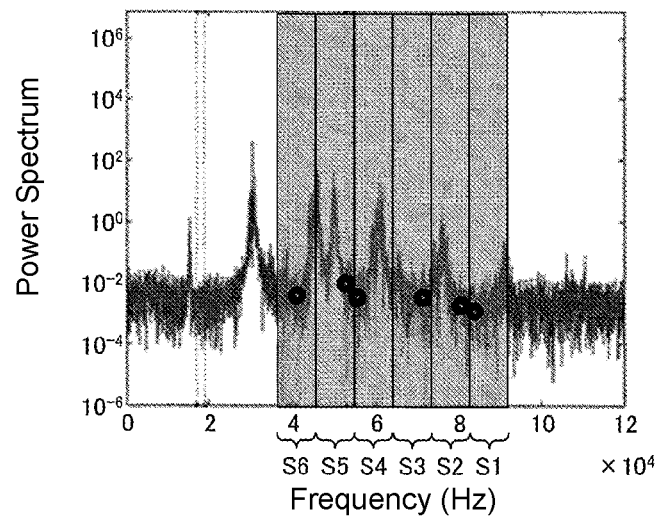
FIG. 13C is a graph showing the arc measurement sections for current signals processed by the FFT processing unit when no arc is being generated in the solar cell strings.

FIG. 13A is a graph showing arc measurement sections S1 to S6 for current signals (power spectrum) processed by the FFT processing unit 41 when an arc is being generated in the solar cell strings 11. FIG. 13B is a graph showing the arc measurement sections S1 to S6 for current signals processed by the FFT processing unit 41 when an arc different from the arc in the example of FIG. 13A is being generated. FIG. 13C is a graph showing the arc measurement sections S1 to S6 for current signals processed by the FFT processing unit 41 when no arc is being generated in the solar cell strings 11. In FIGS. 13A-13O, the sum of the section values S1min to S6min should be above a threshold Ka3. In other words, the section values S1min to S6min and the threshold Ka3 are expressed by Equation (1) below;

$$S1_{min}+S2_{min}+S3_{min}+S4_{min}+S5_{min}+S6_{min}>Ka3 \quad (1).$$

Although the two arc measurement sections S1 and S2 are defined in the above embodiment, more arc measurement sections may be defined as shown in FIGS. 13A to 13C. Although this structure increases the load on the CPU 35, the arc detector 51 with this structure can detect an arc with higher accuracy.

Third Embodiment

Structure of Arc Detector 61

Figure 14A:
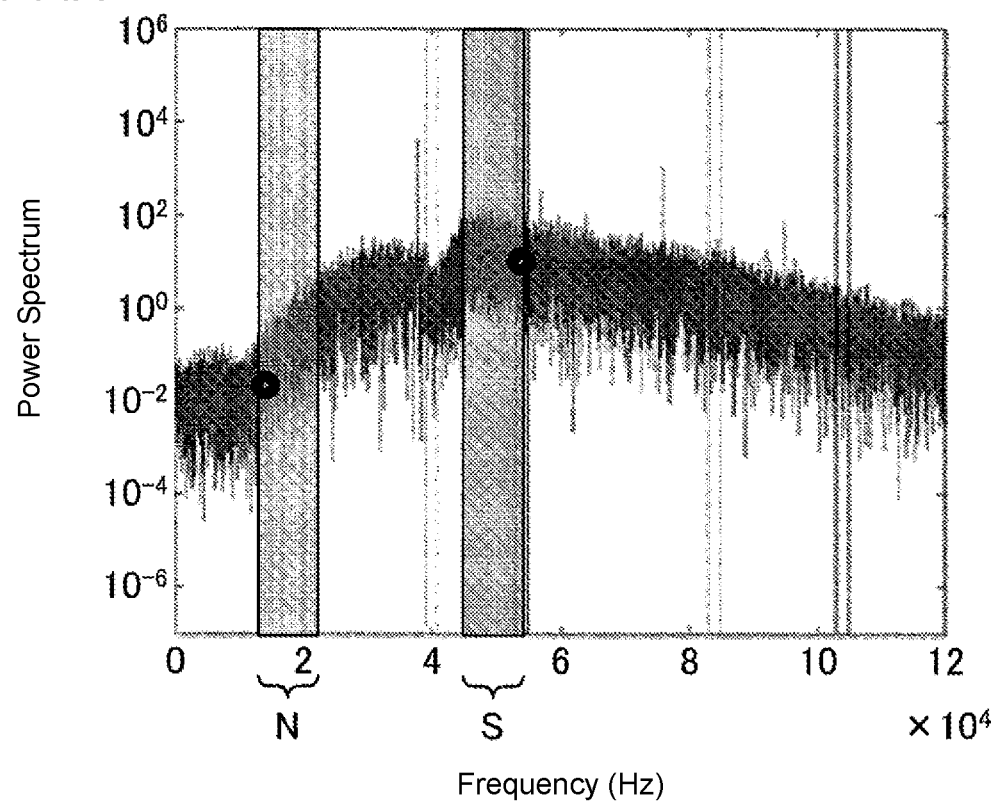
FIG. 14A is a graph showing an arc measurement section and a noise measurement section for current signals processed by the FFT processing unit in the arc detector according to yet another embodiment of the present invention when an arc is being generated in solar cell strings.
Figure 14B:
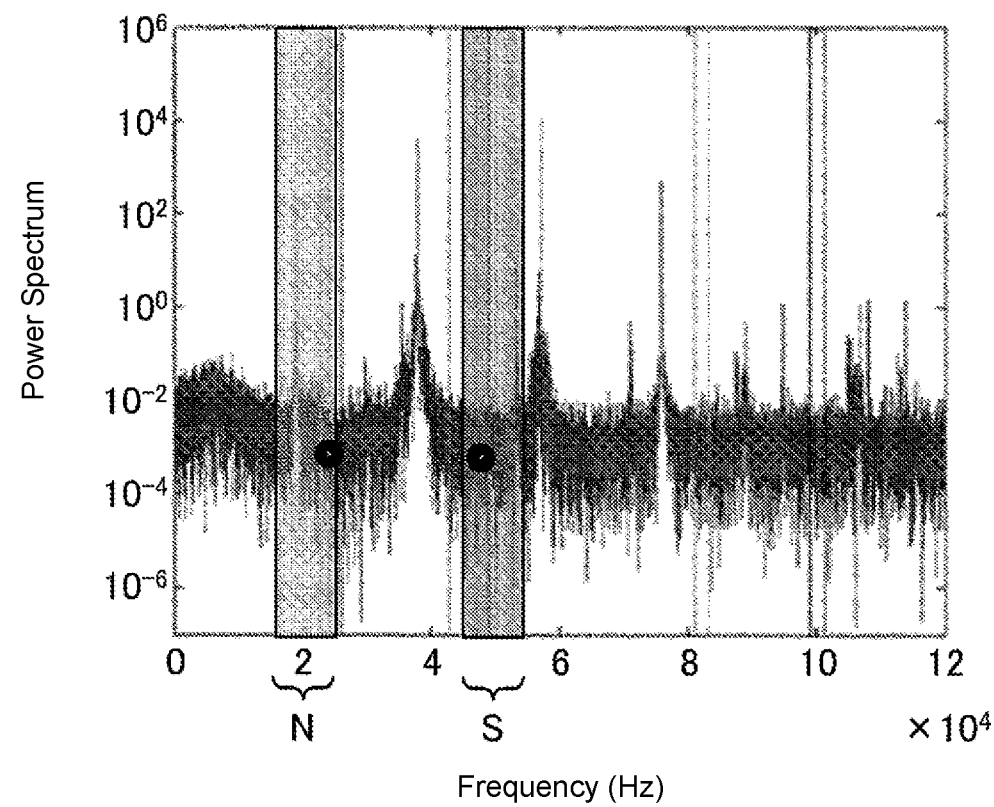
FIG. 14B is a graph showing the arc measurement section and the noise measurement section for current signals processed by the FFT processing unit in the arc detector when no arc is being generated in the solar cell strings.

Another embodiment of the present invention will now be described with reference to the drawings. FIG. 14A is a graph showing an arc measurement section S and a noise measurement section N for current signals (power spectrum) processed by the FFT processing unit 41 in the arc detector 61 according to the present embodiment when an arc is being generated in solar cell strings 11. FIG. 14B is a graph showing the arc measurement section S and the noise measurement section N for current signals processed by the FFT processing unit 41 in the arc detector 61 when no arc is being generated in the solar cell strings 11.

In the present embodiment, the photovoltaic power generation system 1 includes an arc detector 61 (refer to FIG. 2), instead of the arc detector 12. Although the arc detector 61 is shown only in FIG. 2, the arc detector 12 shown in each of FIGS. 1, 6A, 6B, and 8 equates to the arc detector 61.

The arc detector 61 (refer to FIG. 2) detects an arc using a proportional value, unlike the arc detector 12 that detects an arc in the absolute value mode. In this mode using a proportional value, an arc is detected by comparing the ratio (Smin/Nmin) of the section value of the arc measurement section S and the noise measurement section N obtained by the section value obtaining unit 42 with a predetermined threshold. The above ratio is a value near 1 when an arc is not being generated, and is a value greater than 1 and deviating from 1 when an arc is being generated.

In the arc detector 61, the filter 33 passes a signal representing a current having frequencies of, for example, 30 to 100 kHz. As shown in FIGS. 14A and 14B, the FFT processing unit 41 defines an arc measurement section S and a noise measurement section N for a signal representing a current passing through the filter 33, and performs FFT only for the arc measurement section S and the noise measurement section N.

In the present embodiment, the arc measurement section S is intended for the frequencies of 45 to 55 kHz, whereas the noise measurement section N is intended for the frequencies of 15 to 25 kHz. The arc measurement section S is a section in which arc noise can occur frequently. The noise measurement section N is a section in which noise from the PCS 14 can occur frequently.

The section value obtaining unit 42 obtains a section value (Smin) of the arc measurement section S through the same operation as the operation of the section value obtaining unit 42 described above. The section value obtaining unit 42 obtains a section value (Nmin) of the noise measurement section N through the same operation as the operation performed by the section value obtaining unit 42 to obtain the section value (Smin) of the arc measurement section S.

Although the section value of the noise measurement section N is a minimum one of the plurality of region values in the noise measurement section N, the section value may be a relatively small region value in the noise measurement section N, in the same manner as the section value of the arc measurement section S. For example, the section value of the noise measurement section N may be one of region values in the noise measurement section N excluding the maximum region value. When the noise measurement section N has a frequency range greater than 2 kHz, the section value of the noise measurement section N may be one of region values excluding the frequency range of 2 kHz including the maximum region value. The same applies to other embodiments described below.

The arc determination unit 43 compares the ratio (Smin/Nmin) of the section value (Smin) of the arc measurement section S to the section value (Nmin) of the noise measurement section N with a predetermined threshold Kr1 (third threshold), and determines whether the ratio (Smin/Nmin) is greater than the threshold Kr1. When the ratio (Smin/Nmin) is greater than the threshold Kr1, the arc determination unit 43 determines that an arc is detected. When the ratio (Smin/Nmin) is less than or equal to the threshold Kr1, the arc determination unit 43 determines that no arc is detected.

The arc determination unit 43 may compare the ratio (Nmin/Smin) of the section value (Nmin) of the noise measurement section N to the section value (S1min) of the arc measurement section S with the threshold Kr1 to determine whether an arc is detected. In this case, when the ratio (Nmin/Smin) is greater than the threshold Kr1, the arc determination unit 43 determines that no arc is detected. When the ratio (Nmin/Smin) is less than or equal to the threshold Kr1, the arc determination unit 43 determines that an arc is detected.

Operation of Arc Detector 61

Figure 15:
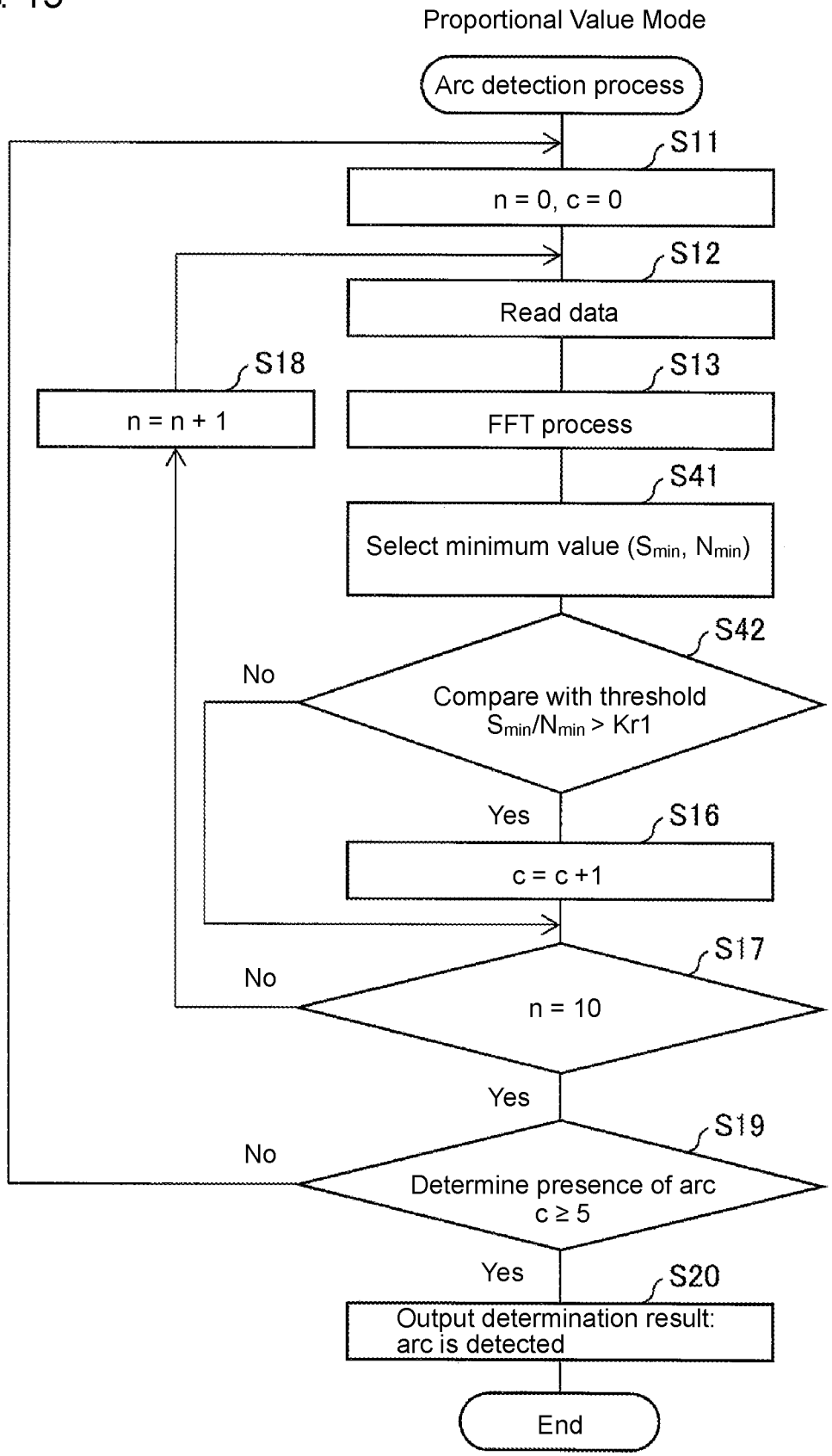
FIG. 15 is a flowchart showing the operation of the arc detector according to yet another embodiment of the present invention.

The operation of the arc detector 61 with the above structure will now be described. FIG. 15 is a flowchart showing the operation of the arc detector 61. In FIG. 15, the operation steps that are the same as those shown in FIG. 7 are given the same numerals as those steps, and will not be described.

The section value obtaining unit 42 divides each of the arc measurement section S (section with 45 to 55 kHz) and the noise measurement section N (section with 15 to 25 kHz) in which FFT has been performed by the FFT processing unit 41 into five regions (regions E) each having a frequency range of 2 kHz as shown in FIG. 5. The section value obtaining unit 42 determines the region value (power spectrum) for each region. The section value obtaining unit 42 obtains a minimum one of the five region values for each of the arc measurement section S and the noise measurement section N as the section values (Smin and Nmin) for the arc measurement section S and the noise measurement section N (S41).

The arc determination unit 43 compares the ratio (Smin/Nmin) of the section values (Smin and Nmin) obtained by the section value obtaining unit 42 with the predetermined threshold Kr1 (S42). The arc determination unit 43 determines that an arc is detected when the ratio (Smin/Nmin) is greater than the threshold Kr1, and determines that no arc is detected when the ratio (Smin/Nmin) is less than or equal to the threshold Kr1.

Advantages of Arc Detector 61

The arc detector 61 according to the present embodiment has the advantages described below, in addition to the advantages produced by the arc detector 12. The arc detector 61 detects an arc by comparing the ratio (Smin/Nmin) of the section values (Smin and Nmin) of the arc measurement section S and the noise measurement section N with the predetermined threshold Kr1. The arc detector 61 can thus detect an arc in a stable manner. The same applies to an arc detector that detects an arc in the proportional value mode described in embodiments below.

The arc determination unit 43 uses the ratio (Smin/Nmin) between the section values (Smin and Nmin) of the arc measurement section S and the noise measurement section N to determine whether an arc is detected. However, the arc determination unit 43 may use a difference (Smin−Nmin) between the section values of the arc measurement section S and the noise measurement section N, instead of the ratio between the section values, to determine whether an arc is detected. The same applies to an arc detector in embodiments described below that uses the section values (Smin and Nmin) of the arc measurement section S and the noise measurement section N.

Fourth Embodiment

Structure of Arc Detector 71

Figure 16A:
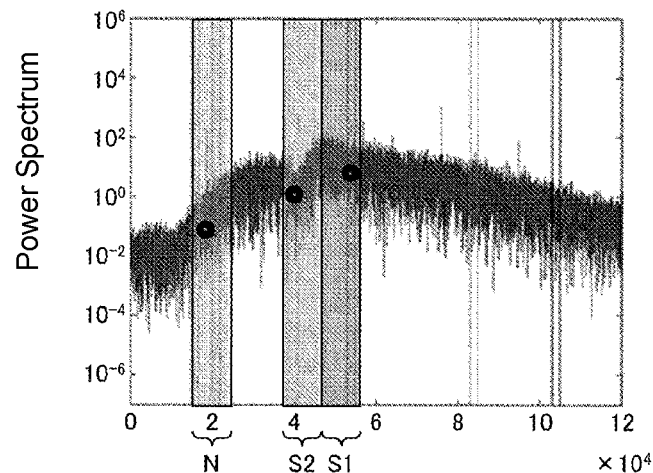
FIG. 16A is a graph showing arc measurement sections and a noise measurement section for current signals processed by the FFT processing unit in the arc detector according to yet another embodiment of the present invention when an arc is being generated in the solar cell strings.
Figure 16B:
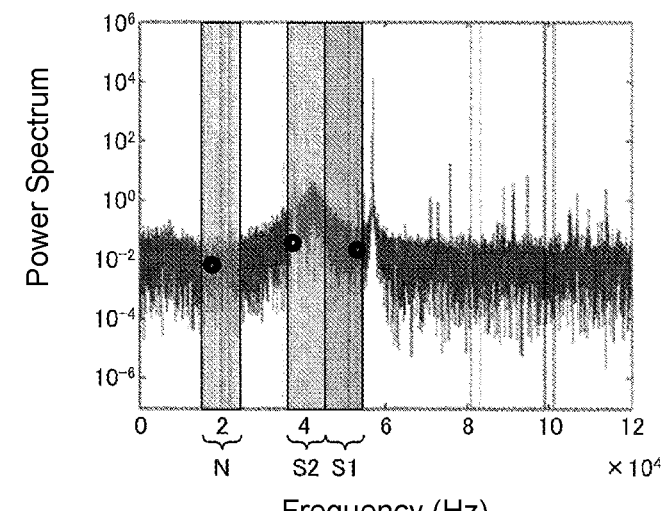
FIG. 16B is a graph showing the arc measurement sections and the noise measurement section for current signals processed by the FFT processing unit when an arc different from the arc in the example of FIG. 16A is being generated.
Figure 16C:
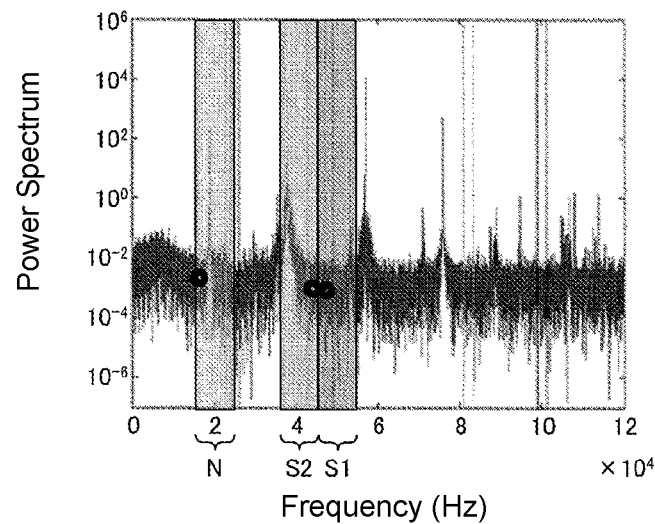
FIG. 16C is a graph showing the arc measurement sections and the noise measurement section for current signals processed by the FFT processing unit in the arc detector when no arc is being generated in the solar cell strings.

Another embodiment of the present invention will now be described with reference to the drawings. FIG. 16A is a graph showing arc measurement sections S1 and S2 and a noise measurement section N for current signals (power spectrum) processed by the FFT processing unit 41 in the arc detector 71 according to the present embodiment when an arc is being generated in solar cell strings 11. FIG. 16B is a graph showing the arc measurement sections S1 and S2 and the noise measurement section N for current signals processed by the FFT processing unit 41 when an arc different from the arc in the example of FIG. 16A is being generated. FIG. 16C is a graph showing the arc measurement sections S1 and S2 and the noise measurement section N for current signals processed by the FFT processing unit 41 in the arc detector 71 when no arc is being generated in the solar cell strings 11.

In the present embodiment, the photovoltaic power generation system 1 includes an arc detector 71 (refer to FIG. 2), instead of the arc detector 12. Although the arc detector 71 is shown only in FIG. 2, the arc detector 12 shown in each of FIGS. 1, 6A, 6B, and 8 equates to the arc detector 71.

In the same manner as the arc detector 61, the arc detector 71 (refer to FIG. 2) detects an arc in the proportional value mode. As shown in FIGS. 16A to 16C, the FFT processing unit 41 in the arc detector 71 defines arc measurement sections S1 and S2 and a noise measurement section N for a signal representing a current passing through the filter 33, and performs FFT only for the arc measurement sections S1 and S2 and the noise measurement section N.

In the present embodiment, the arc measurement section S1 is intended for the frequencies of 45 to 55 kHz, the arc measurement section S2 is intended for the frequencies of 35 to 45 kHz, and the noise measurement section N is intended for the frequencies of 15 to 25 kHz. The filter 33 passes a signal representing a current having frequencies of, for example, 30 to 100 kHz.

The section value obtaining unit 42 obtains a section value (S1min) of the arc measurement section S1, a section value (S2min) of the arc measurement section S2, and a section value (Nmin) of the noise measurement section N through the same operation as the operation of the section value obtaining unit 42 described above.

The arc determination unit 43 compares the ratio (S1min+S2min)/Nmin of the sum (S1min+S2min) of the section value (S1min) and the section value (S2min) to the section value (Nmin) with a predetermined threshold Kr2 (fourth threshold), and determines whether the ratio (S1min+S2min)/Nmin is greater than the threshold Kr2. When the ratio (S1min+S2min)/Nmin is greater than the threshold Kr2, the arc determination unit 43 determines that an arc is detected. When the ratio (S1min+S2min)/Nmin is less than or equal to the threshold Kr2, the arc determination unit 43 determines that no arc is detected.

In the same manner as for the arc detector 61, the arc determination unit 43 in the arc detector 71 may compare the ratio Nmin/(S1min+S2min) of the section value (Nmin) to the sum (S1min+S2min) with the threshold Kr2 to determine whether an arc is detected.

As described above, the arc determination unit 43 may compare the ratio of a section value selected for the plurality of arc measurement sections S1 and S2 (e.g., a minimum section value) to the section value for the section N with a threshold to determine whether an arc is detected. Further, the arc determination unit 43 may compare the ratio of the difference between the section values for the arc measurement sections S1 and S2 to the section value for the section N with a threshold to determine whether an arc is detected.

Figure 17:
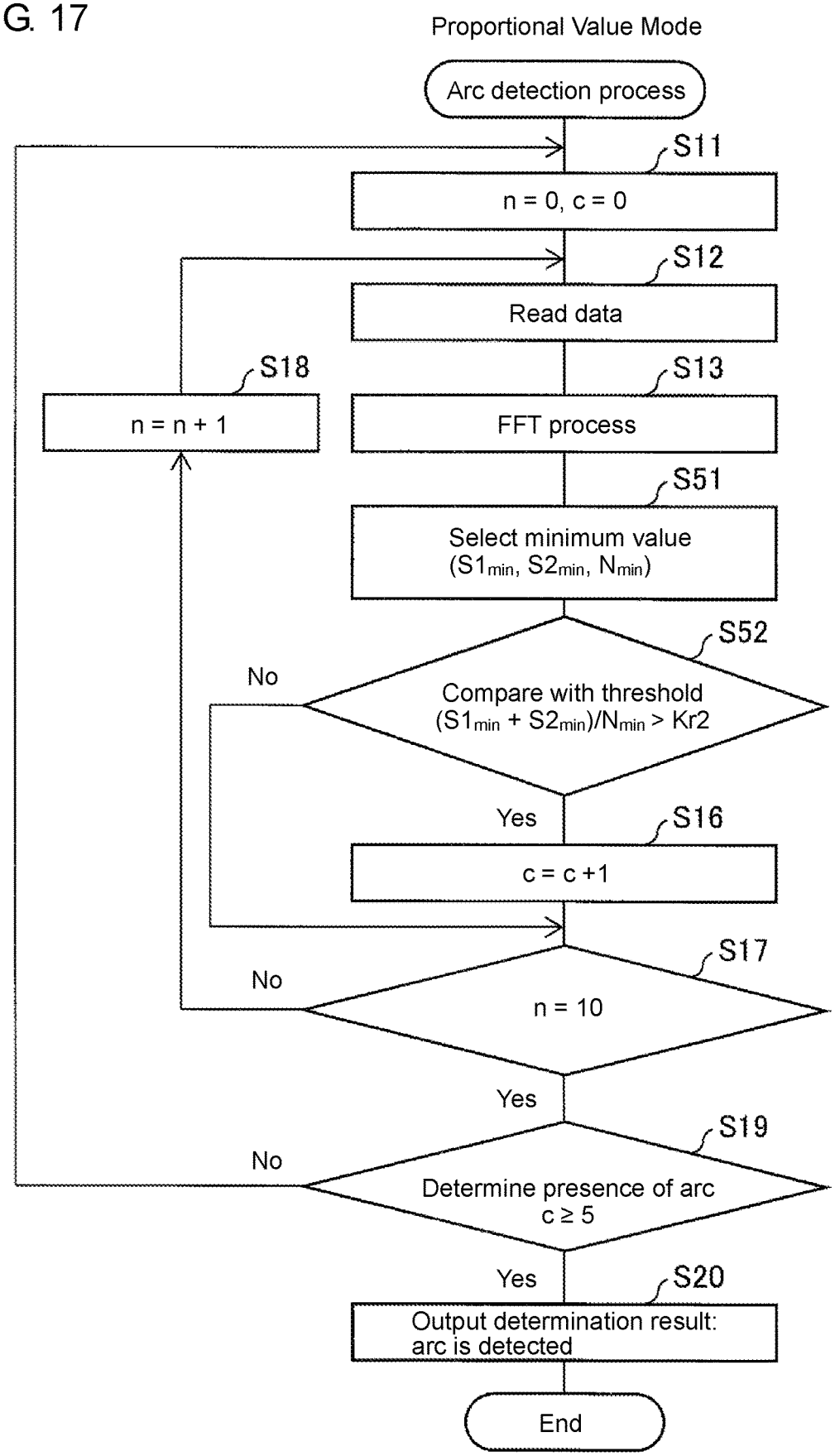
FIG. 17 is a flowchart showing the operation of the arc detector according to yet another embodiment of the present invention.

The operation of the arc detector 71 with the above structure will now be described. FIG. 17 is a flowchart showing the operation of the arc detector 71. In FIG. 17, the operation steps that are the same as those shown in FIG. 7 are given the same numerals as those steps, and will not be described.

The section value obtaining unit 42 divides each of the arc measurement section S1 (section with 45 to 55 kHz), the arc measurement section S2 (section with 35 to 45 kHz), and the noise measurement section N (section with 15 to 25 kHz) in which FFT has been performed by the FFT processing unit 41 into five regions (regions E) each having a frequency range of 2 kHz as shown in FIG. 5. The section value obtaining unit 42 determines the region value (power spectrum) for each region. The section value obtaining unit 42 obtains a minimum one of the five region values for each of the arc measurement sections S1 and S2 and the noise measurement section N as the section values (S1min, S2min, and Nmin) for the arc measurement sections S1 and S2 and the noise measurement section N (S51).

For the section values (S1min, S2min, and Nmin) obtained by the section value obtaining unit 42, the arc determination unit 43 compares the ratio (S1min+S2min)/Nmin, which is the ratio of the sum (S1min+S2min) of the section value (S1min) and the section value (S2min) to the section value (Nmin), with the predetermined threshold Kr2 (S52). The arc determination unit 43 determines that an arc is detected when the ratio (S1min+S2min)/Nmin is greater than the threshold Kr2, and determines that no arc is detected when the ratio (S1min+S2min)/Nmin is less than or equal to the threshold Kr2.

Figure 18:
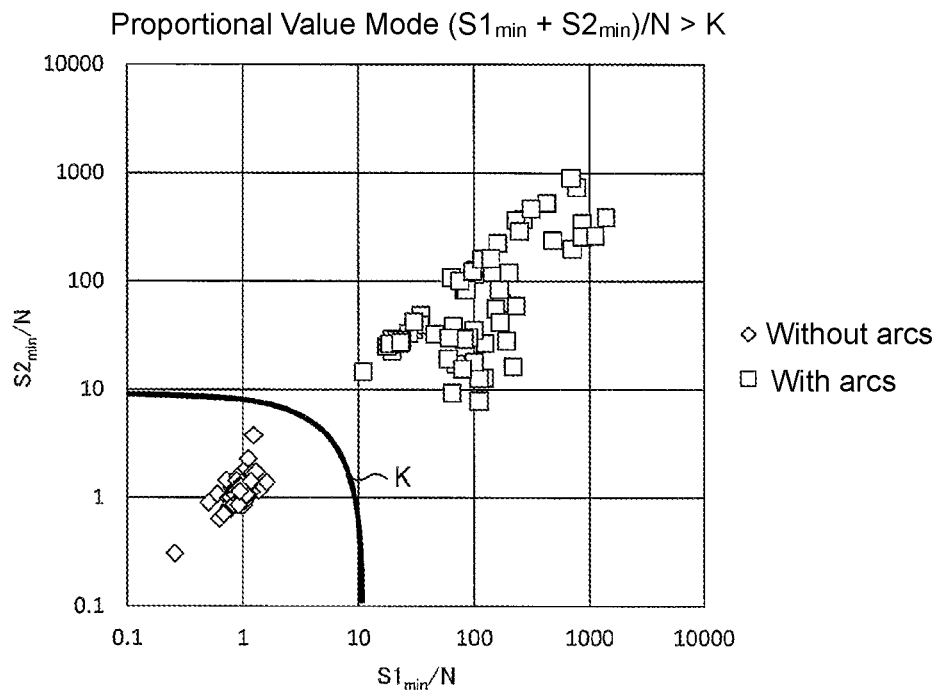
FIG. 18 is a scatter diagram showing the relationship between the ratio of the sum of section values of the two arc measurement sections to section values of the noise measurement section and a threshold for describing the operation of the arc determination unit in the arc detector according to yet another embodiment of the present invention.

FIG. 18 is a graph showing the relationship between the ratio (S1min+S2min)/Nmin and the threshold Kr2 when the arc determination unit 43 determines that an arc is detected based on the ratio (S1min+S2min)/Nmin>the threshold Kr2. FIG. 18 is a scatter diagram showing the relationship between the ratio (S1min+S2min)/Nmin of the sum of the section values of the arc measurement sections S1 and S2 to the section values of the noise measurement section N and the threshold Kr2.

Figure 19:
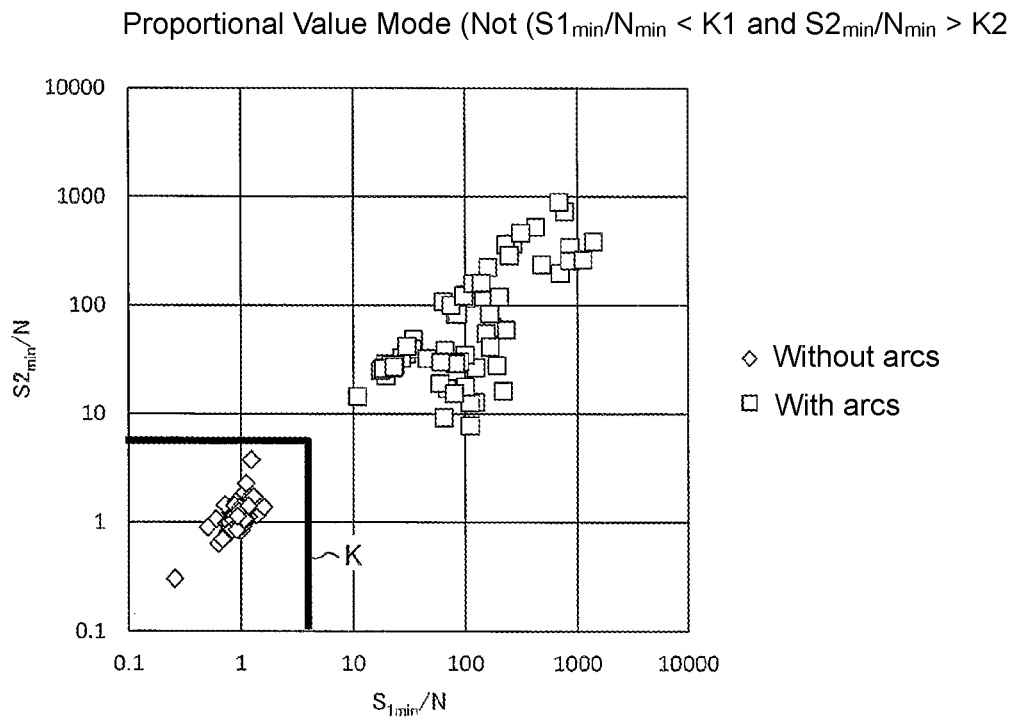
FIG. 19 is a scatter diagram showing the relationship between the ratios of section values of the two arc measurement sections to section values of the noise measurement section and thresholds different from the relationship shown in FIG. 18.

FIG. 19 is a graph showing the relationship between the ratios (S1min/Nmin and S2min/Nmin) of the sum of the section values of the arc measurement sections S1 and S2 to the section value of the noise measurement section N, and the thresholds (K1 and K2), which is different from the relationship shown in FIG. 18. In this example of FIG. 19, the arc determination unit 43 determines that an arc is detected based on Not (S1min/Nmin)<K1 and (S2min/Nmin)<K2.

Advantages of Arc Detector 71

The arc detector 71 according to the present embodiment has the advantages described below, in addition to the advantages produced by the arc detector 12.

As described above, the arc detector 71 defines the multiple arc measurement sections S1 and S2 for signals (power spectrum) representing a current detected from the output line (e.g., the output line 22a) of the solar cell strings 11, and compares the ratio of the sum (S1min+S2min) of the section values (S1min and S2min) obtained from the arc measurement sections S1 and S2 to the section value (Nmin) obtained from the noise measurement section N with the predetermined threshold to determine the presence of an arc.

The arc detector 71 compares the ratios of the section values of the arc measurement sections S1 and S2 to the section value of the noise measurement section N with the predetermined threshold to determine the presence of an arc. In other words, the arc detector 71 obtains more samples than obtained by the arc detector 12 and determines the presence of an arc, and can thus detect an arc with higher accuracy.

Modifications

Figure 20A:
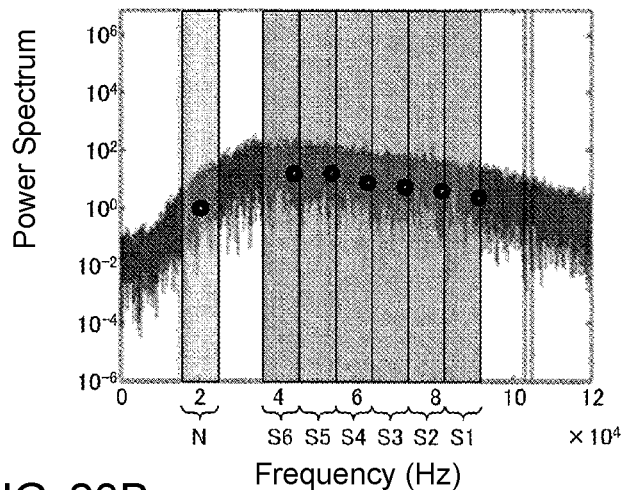
FIG. 20A is a graph showing arc measurement sections and a noise measurement section for current signals (power spectrum) processed by the FFT processing unit when an arc is being generated in solar cell strings in the arc detector according to a modification of yet another embodiment of the present invention.
Figure 20B:
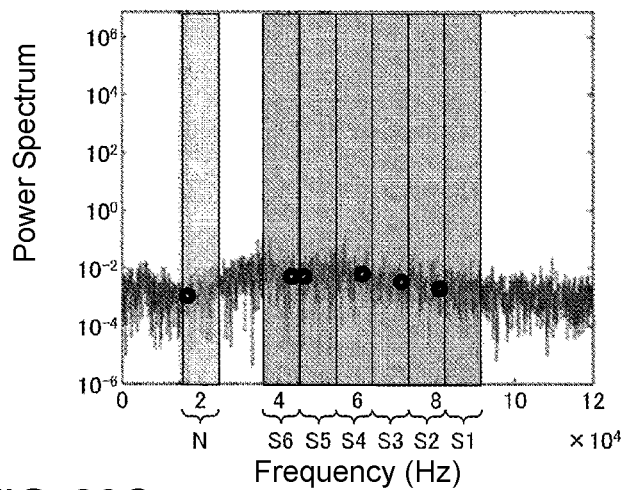
FIG. 20B is a graph showing the arc measurement sections and the noise measurement section for current signals processed by the FFT processing unit when an arc different from the arc in the example of FIG. 20A is being generated.
Figure 20C:
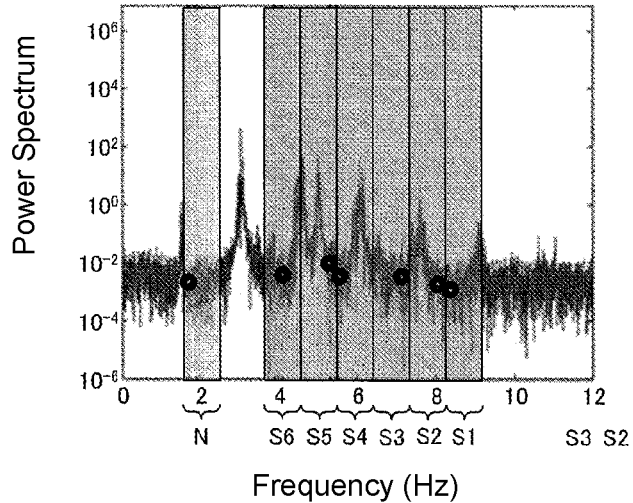
FIG. 20C is a graph showing the arc measurement sections and the noise measurement section for current signals processed by the FFT processing unit when no arc is being generated in the solar cell strings.

Although the two arc measurement sections S1 and S2 are defined in the above embodiment, more arc measurement sections may be defined as shown in FIGS. 20A to 20C. FIG. 20A is a graph showing arc measurement sections S1 to S6 for current signals (power spectrum) processed by the FFT processing unit 41 when an arc is being generated in the solar cell strings 11. FIG. 20B is a graph showing the arc measurement sections S1 to S6 for current signals processed by the FFT processing unit 41 when an arc different from the arc in the example of FIG. 20A is being generated. FIG. 20C is a graph showing the arc measurement sections S1 to S6 for current signals processed by the FFT processing unit 41 when no arc is being generated in the solar cell strings 11. In FIGS. 20A-20C, the sum of the section values S1min to S6min should be above a threshold K. In other words, the section values S1min to S6min and the threshold K are expressed by Equation (2) below;

$$S1_{min}+S2_{min}+S3_{min}+S4_{min}+S5_{min}+S6_{min}>K \quad (2).$$

The arc detector according to embodiments of the present invention includes a current sensor that detects an output current from a distributed direct-current power supply, a power spectrum conversion unit that converts the output current from the current sensor to a power spectrum, a section value obtaining unit that divides an arc measurement section for the power spectrum having a predetermined frequency range into a plurality of regions, and obtains, from region values determined for the plurality of regions each indicating a magnitude of a power spectrum and excluding a maximum one of the region values, a region value to be a section value of the arc measurement section, and an arc determination unit that determines a presence of an arc based on the section value.

In this structure, the current sensor detects the output current from the distributed direct-current power supply. The power spectrum conversion unit converts the output current from the current sensor to the power spectrum. The section value obtaining unit divides the arc measurement section for the power spectrum having the predetermined frequency range into the plurality of regions, and obtains, from the region values each indicating the magnitude of the power spectrum for each region and excluding the maximum one of the region values, the region value to be the section value of the arc measurement section. The arc determination unit determines the presence of an arc based on the section value obtained by the section value obtaining unit.

When the distributed direct-current power supply is connected to an external device (e.g., a power conditioner), the arc detector can detect an arc independently of the frequency bandwidth of noise generated from the external device. In other words, the arc detector can eliminate the influence of noise from the external device (e.g., the power conditioner) included in the maximum region value in the measurement section, and can detect an arc despite any changes in the frequency bandwidth of noise generated from the external device (e.g., the power conditioner).

This structure can reduce the influence of noise generated from the external device connected to the distributed direct-current power supply, and can easily detect an arc.

The arc detector according to embodiments of the present invention includes a current sensor that detects an output current from a distributed direct-current power supply, a power spectrum conversion unit that converts the output current from the current sensor to a power spectrum, a section value obtaining unit that divides an arc measurement section for the power spectrum having a predetermined frequency range into a plurality of regions, obtains, from region values determined for the plurality of regions each indicating a magnitude of a power spectrum and excluding a maximum one of the region values, a region value to be a section value of the arc measurement section, and obtains a section value of a noise measurement section for the power spectrum having a frequency range different from the frequency range of the arc measurement section, and an arc determination unit that determines a presence of an arc based on the section value of the arc measurement section and the section value of the noise measurement section.

In this structure, the current sensor detects the output current from the distributed direct-current power supply. The power spectrum conversion unit converts the output current from the current sensor to the power spectrum. The section value obtaining unit divides the arc measurement section for the power spectrum having the predetermined frequency range into the plurality of regions, obtains, from the region values each indicating the magnitude of the power spectrum for one of the regions and excluding the maximum one of the region values, the region value to be the section value of the arc measurement section, and obtains the section value of the noise measurement section for the power spectrum having the frequency range different from the frequency range of the arc measurement section. The arc determination unit determines a presence of an arc based on the section value of the arc measurement section and the section value of the noise measurement section.

When the distributed direct-current power supply is connected to an external device (e.g., a power conditioner), the arc detector can detect an arc independently of the frequency bandwidth of noise generated from the external device. In other words, the arc detector can eliminate the influence of noise from the external device (e.g., the power conditioner) included in the maximum region value in the measurement section, and can detect an arc despite any changes in the frequency bandwidth of noise generated from the external device (e.g., the power conditioner).

This structure can reduce the influence of noise generated from the external device connected to the distributed direct-current power supply, and can easily detect an arc. The arc determination unit can determine the presence of an arc in a more stable manner than the structure that only uses the section value of the arc measurement section. The arc detector can thus detect an arc more in a stable manner.

In the arc detector described above, the section value obtaining unit may obtain, as the section value, a minimum one of the region values determined for the plurality of regions.

In this structure, the section value obtaining unit obtains, as the section value, the minimum one of the region values determined for the plurality of regions. The arc detector can thus detect an arc accurately and easily by eliminating noise in the measurement section generated from the external device (e.g., the power conditioner) in a reliable manner.

In the arc detector described above, the measurement section may have a frequency range greater than 2 kHz, and the section value obtaining unit may obtain the region value to be selected as the section value from a portion of the measurement section excluding a frequency range of 2 kHz including a frequency corresponding to a maximum value of the power spectrum.

In this structure, when the measurement section has the frequency range greater than 2 kHz, the section value obtaining unit obtains the region value to be selected as the section value from the portion of the measurement section excluding the range with the frequency of 2 kHz corresponding to the maximum value of the power spectrum.

In this manner, the range with the frequency of 2 kHz corresponding to the maximum value of the power spectrum may be excluded from the measurement section. As a result, the region value to be selected as the section value becomes relatively small. When the region value is selected as the section value by excluding the range with the frequency of 2 kHz corresponding to the maximum value of the power spectrum in the measurement section, the arc detector can more easily eliminate the influence of noise generated from the external device.

This structure can reduce the influence of noise generated from an external device connected to solar cells further, and can detect an arc accurately and easily.

In the arc detector described above, the arc determination unit may determine a presence of an arc by comparing the section value with a predetermined threshold.

The arc detector with the above structure can reduce the influence of noise generated from an external device connected to the distributed direct-current power supply, and can easily detect an arc.

In the arc detector described above, the section value obtaining unit may obtain a plurality of section values of a plurality of the arc measurement sections, and the arc determination unit may determine a presence of an arc by comparing a value calculated using the plurality of section values with a predetermined threshold.

In this structure, the arc determination unit determines the presence of an arc by comparing the value calculated using the plurality of section values obtained by the section value obtaining unit, for example, the sum of the plurality of section values, with the predetermined threshold. The arc detector can thus detect an arc more accurately than the structure that uses the section value of the single measurement section.

In the arc detector described above, the section value obtaining unit may obtain a plurality of section values of a plurality of the arc measurement sections, and the arc determination unit may determine a presence of an arc by comparing a selected one of the plurality of section values with a predetermined threshold.

In this structure, the arc determination unit determines the presence of an arc by comparing the selected one of the plurality of section values obtained by the section value obtaining unit with the predetermined threshold.

The arc determination unit can thus select and use a suitable one of the plurality of section values obtained by the section value obtaining unit for determining the presence of an arc, which is for example a minimum section value. The arc detector can thus detect an arc more accurately than the structure that uses the section value of the single measurement section.

In the arc detector described above, the arc determination unit may determine a presence of an arc by comparing a ratio of the section value of the arc measurement section to the section value of the noise measurement section with a predetermined threshold, or by comparing a difference between the section value of the arc measurement section and the section value of the noise measurement section with a predetermined threshold.

In this structure, the arc determination unit determines the presence of an arc by comparing the ratio of the section value of the arc measurement section to the section value of the noise measurement section, which are obtained by the section value obtaining unit, with the predetermined threshold, or by comparing the difference between the section value of the arc measurement section and the section value of the noise measurement section with the predetermined threshold. The arc determination unit can thus determine the presence of an arc in a more stable manner than the structure that only uses the section value of the arc measurement section. The arc detector can thus detect an arc easily and in a stable manner.

In the arc detector described above, the section value obtaining unit may obtain a plurality of section values of a plurality of the arc measurement sections, and the arc determination unit may determine a presence of an arc by comparing a ratio of a value calculated using the plurality of section values of the plurality of the arc measurement sections to the section value of the noise measurement section with a predetermined threshold.

In this structure, the section value obtaining unit obtains the plurality of section values of the plurality of the arc measurement sections, and the arc determination unit determines the presence of an arc by comparing the ratio of the value calculated using the plurality of section values of the arc measurement sections, for example, the sum of the plurality of the section values, to the section value of the noise measurement section with the predetermined threshold. The arc determination unit can thus determine the presence of an arc in a more stable manner and more accurately than the structure that only uses the section value of the arc measurement section. The arc detector can thus detect an arc easily and accurately and in a more stable manner.

In the arc detector described above, the section value obtaining unit may obtain a plurality of section values of a plurality of the arc measurement sections, and the arc determination unit may determine a presence of an arc by comparing a ratio of a selected one of the plurality of section values to the section value of the noise measurement section with a predetermined threshold, or by comparing a difference between the selected one of the plurality of section values and the section value of the noise measurement section with a predetermined threshold.

In this structure, the section value obtaining unit obtains the plurality of section values of the arc measurement sections, and the arc determination unit determines the presence of an arc by comparing the ratio of the selected one of the plurality of the section values, which is for example a minimum section value, to the section value of the noise measurement section with the predetermined threshold, or by comparing the difference between the selected one of the plurality of section values and the section value of the noise measurement section with the predetermined threshold.

The arc determination unit can thus select and use a suitable one of the plurality of section values obtained by the section value obtaining unit for determining the presence of an arc, which is for example a minimum section value. The arc determination unit can determine the presence of an arc in a more stable manner and more accurately than the structure that only uses the section value of the arc measurement section. The arc detector can thus detect an arc more easily and more accurately and in a more stable manner than the structure that uses the section value of the single measurement section or the structure that only uses the section value of the arc measurement section.

In the arc detector described above, the power spectrum conversion unit may convert the output current from the current sensor to a power spectrum for the measurement section.

In this structure, the power spectrum conversion unit converts the output current from the current sensor to the power spectrum for the measurement section. Thus, the arc detector may achieve high-speed processing as a whole when using a low-performance, inexpensive CPU as the power spectrum conversion unit.

An arc detection method according to embodiments of the present invention includes detecting an output current from a distributed direct-current power supply, converting the output current detected in the current detection process to a power spectrum, dividing an arc measurement section for the power spectrum having a predetermined frequency range into a plurality of regions, and obtaining, from region values determined for the plurality of regions each indicating a magnitude of a power spectrum and excluding a maximum one of the region values, a region value to be a section value of the arc measurement section, and determining a presence of an arc based on the section value of the arc measurement section obtained in the section value obtaining process.

In this structure, the current detection process detects an output current from a distributed direct-current power supply, the power spectrum conversion process converts the output current detected in the current detection process to a power spectrum. The section value obtaining process divides an arc measurement section for the power spectrum having a predetermined frequency range into a plurality of regions, and obtains, from region values determined for the plurality of regions each indicating a magnitude of a power spectrum and excluding a maximum one of the region values, a region value to be a section value of the arc measurement section. The arc determination process determines a presence of an arc based on the section value of the arc measurement section obtained in the section value obtaining process. This arc detection method thus provides the same advantageous effects as the arc detector described above.

An arc detection method according to embodiments of the present invention includes detecting an output current from a distributed direct-current power supply, converting the output current detected in the current detection process to a power spectrum, dividing an arc measurement section for the power spectrum having a predetermined frequency range into a plurality of regions, obtaining, from region values determined for the plurality of regions each indicating a magnitude of a power spectrum and excluding a maximum one of the region values, a region value to be a section value of the arc measurement section, and obtaining a section value of a noise measurement section for the power spectrum having a frequency range different from the frequency range of the arc measurement section, and determining a presence of an arc based on the section value of the arc measurement section and the section value of the noise measurement section.

In this structure, the current detection process detects an output current from a distributed direct-current power supply, and the power spectrum conversion process converts the output current detected in the current detection process to a power spectrum. The section value obtaining process divides an arc measurement section for the power spectrum having a predetermined frequency range into a plurality of regions, obtains, from region values determined for the plurality of regions each indicating a magnitude of a power spectrum and excluding a maximum one of the region values, a region value to be a section value of the arc measurement section, and obtains a section value of a noise measurement section for the power spectrum having a frequency range different from the frequency range of the arc measurement section. The arc determination process determines a presence of an arc based on the section value of the arc measurement section and the section value of the noise measurement section. This arc detection method thus provides the same advantageous effects as the arc detector described above.

The embodiments disclosed herein should not be construed to be restrictive, but may be modified within the spirit and scope of the claimed invention. The technical features disclosed in different embodiments may be combined in other embodiments within the technical scope of the invention.

INDUSTRIAL APPLICABILITY

One aspect of the present invention is usable as an arc detector for a photovoltaic power generation system including a direct-current power supply (distributed direct-current power supply), such as solar cell strings, connected to a PCS that is a source of noise.

REFERENCE SIGNS LIST 1 photovoltaic power generation system
11 solar cell string (distributed direct-current power supply)
12 arc detector
13 junction box
14 power conditioning system (external device)
15 photovoltaic array
21 solar module
22a output line
22b output line
31 current sensor
32 amplifier
33 filter
34 A-D conversion unit
35 CPU
41 FFT processing unit (power spectrum conversion unit)
42 section value obtaining unit
43 arc determination unit
51 arc detector
61 arc detector
71 arc detector
S1, S2 arc measurement section
N noise measurement section

The invention claimed is:

1. An arc detector, comprising:
a current sensor configured to detect an output current from a distributed direct-current power supply; and
a processor configured to perform operations comprising:
operation as a power spectrum conversion unit configured to convert the output current from the current sensor to a power spectrum;
operation as a section value obtaining unit configured to
divide an arc measurement section for the power spectrum having a predetermined frequency range-into a plurality of regions, and
obtain, from region values determined for the plurality of regions, each of the region values indicating a magnitude of the power spectrum for a respective region of the plurality of regions, and with a maximum one of the region values being excluded, a region value to be a section value of the arc measurement section; and
operation as an arc determination unit configured to determine a presence of an arc by comparing the magnitude of the power spectrum for the section value with a predetermined threshold.

2. The arc detector according to claim 1, wherein the processor is configured to perform operations such that operation as the section value obtaining unit comprises operation as the section value obtaining unit that obtains, as the section value, a minimum one of the region values determined for the plurality of regions.

3. The arc detector according to claim 1, wherein
the arc measurement section has a frequency range greater than 2 kHz, and
the processor is configured to perform operations such that operation as the section value obtaining unit comprises operation as the section value obtaining unit that obtains the region value to be selected as the section value from a portion of the arc measurement section that excludes a frequency range of 2 kHz the frequency range comprising a frequency corresponding to a maximum value of the power spectrum.

4. The arc detector according to claim 1, wherein the processor is configured to perform operations such that:
operation as the section value obtaining unit comprises operation as the section value obtaining unit that obtains a plurality of the section values for a plurality of the arc measurement sections, and
operation as the arc determination unit comprises operation as the arc determination unit that determines the presence of the arc by comparing a value calculated using the plurality of the section values with the predetermined threshold.

5. The arc detector according to claim 1, wherein the processor is configured to perform operations such that:
operation as the section value obtaining unit comprises operation as the section value obtaining unit that obtains a plurality of the section values for a plurality of the arc measurement sections, and
operation as the arc determination unit comprises operation as the arc determination unit that determines the presence of the arc by comparing a selected one of the plurality of the section values with the predetermined threshold.

6. The arc detector according to claim 1, wherein the processor is configured to perform operations such that operation as the power spectrum conversion unit comprises operation as the power spectrum conversion unit that converts the output current from the current sensor to the power spectrum for the arc measurement section.

7. An arc detector, comprising:
a current sensor configured to detect an output current from a distributed direct-current power supply; and
a processor configured to perform operations comprising:
operation as a power spectrum conversion unit configured to convert the output current from the current sensor to a power spectrum;
operation as a section value obtaining unit configured to:

divide an arc measurement section for the power spectrum having a predetermined frequency range into a plurality of regions, obtain, from region values determined for the plurality of regions each of the region values indicating a magnitude of the power spectrum for a respective region of the plurality of regions, and with a maximum one of the region values being excluded, a region value to be a section value of the arc measurement section, and obtain a section value of a noise measurement section for the power spectrum having a frequency range different from the frequency range of the arc measurement section; and operation as an arc determination unit configured to determine a presence of an on by comparing a value calculated from the section value of the arc measurement section and the section value of the noise measurement section with a predetermined threshold.

8. The arc detector according to claim 7, wherein the processor is configured to perform operations such that:

operation as the arc determination unit comprises operation as the arc determination unit that determines the presence of the arc by comparing, as the value calculated from the section value of the arc measurement section and the section value of the noise measurement section, at least one of a ratio of the section value of the arc measurement section to the section value of the noise measurement section, and a difference between the section value of the arc measurement section and the section value of the noise measurement section, with the predetermined threshold.

9. The arc detector according to claim 7, wherein the processor is configured to perform operations such that:

operation as the section value obtaining unit comprises operation as the section value obtaining unit that obtains a plurality of the section values for a plurality of the arc measurement sections, and operation as the arc determination unit comprises operation as the arc determination unit that determines the presence of the arc by comparing, as the value calculated from the section value of the arc measurement section and the section value of the noise measurement section, a ratio calculated using the plurality of the section values of the plurality of the arc measurement sections to the section value of the noise measurement section, with the predetermined threshold.

10. The arc detector according to claim 7, wherein the processor is configured to perform operations such that:

operation as the section value obtaining unit comprises operation as the section value obtaining unit that obtains a plurality of the section values for a plurality of the arc measurement sections, and operation as the arc determination unit comprises operation as the arc determination unit that determines the presence of the arc by comparing, as the value calculated from the section value of the arc measurement section and the section value of the noise measurement section, at least one of a ratio of a selected one of the plurality of the section values to the section value of the noise measurement section, and a difference between the selected one of the plurality of the section values and the section value of the noise measurement section, with the predetermined threshold.

11. An arc detection method, comprising:

detecting an output current from a distributed direct-current power supply;

converting the output current detected from the distributed direct-current power supply to a power spectrum;

dividing an arc measurement section for the power spectrum having a predetermined frequency range into a plurality of regions;

obtaining, from region values determined for the plurality of regions, each of the region values indicating a magnitude of the power spectrum for a respective region of the plurality of regions, and with a maximum one of the region values being excluded, a region value to be a section value of the arc measurement section; and determining a presence of an arc by comparing the magnitude of the power spectrum for the section value obtained with a predetermined threshold.

12. An arc detection method, comprising:

detecting an output current from a distributed direct-current power supply;

converting the output current detected from the distributed direct-current power supply to a power spectrum;

dividing an arc measurement section for the power spectrum having a predetermined frequency range into a plurality of regions;

obtaining, from region values determined for the plurality of regions, each of the region values indicating a magnitude of the power spectrum for a respective region of the plurality of regions, and with a maximum one of the region values being excluded, a region value to be a section value of the arc measurement section;

obtaining a section value of a noise measurement section for the power spectrum having a frequency range different from the frequency range of the arc measurement section; and determining a presence of an arc by comparing a value calculated from the section value of the arc measurement section and the section value of the noise measurement section with a predetermined threshold.

13. The arc detection method according to claim 12, wherein the presence of the arc is determined by comparing, as the value calculated from the section value of the arc measurement section and the section value of the noise measurement section, at least one of a ratio of the section value of the arc measurement section to the section value of the noise measurement section, and a difference between the section value of the arc measurement section and the section value of the noise measurement section, with the predetermined threshold.

14. The arc detection method according to claim 12, further comprising:

obtaining a plurality of the section values for a plurality of the arc measurement sections, wherein the presence of the arc is determined by comparing, as the value calculated from the section value of the arc measurement section and the section value of the noise measurement section, a ratio calculated using the plurality of the section values of the plurality of the arc measurement sections to the section value of the noise measurement section, with the predetermined threshold.

15. The arc detection method according to claim 12, further comprising obtaining a plurality of the section values for a plurality of the arc measurement sections, wherein the presence of the arc is determined by comparing, as the value calculated from the section value of the arc measurement section and the section value of the noise measurement section, at least one of a ratio of a selected one of the plurality of the section values to the section value of the noise measurement section, and a difference between the selected one of the plurality of the section values and the section value of the noise measurement section, with the predetermined threshold.

* * * * *